(12) United States Patent
Kim

(10) Patent No.: US 10,348,324 B2
(45) Date of Patent: Jul. 9, 2019

(54) DIGITAL-TO-ANALOG CONVERTER AND SOURCE DRIVER USING THE SAME

(71) Applicant: INNOAXIS CO., LTD, Namyangju-si, Gyeonggi-do (KR)

(72) Inventor: Hwi-Cheol Kim, Seoul (KR)

(73) Assignee: INNOAXIS CO., LTD, Namyangju-si, Gyeonggi-Do (KR)

( * ) Notice: Subject to any disclaimer, the term of this patent is extended or adjusted under 35 U.S.C. 154(b) by 0 days.

(21) Appl. No.: 15/816,197

(22) Filed: Nov. 17, 2017

(65) Prior Publication Data

US 2018/0102785 A1 Apr. 12, 2018

Related U.S. Application Data

(63) Continuation of application No. 15/464,986, filed on Mar. 21, 2017, now Pat. No. 9,825,644.

(30) Foreign Application Priority Data

Mar. 21, 2016 (KR) .......................... 10-2016-0033576

(51) Int. Cl.
| | |
|---|---|
| *H03M 1/66* | (2006.01) |
| *G09G 3/20* | (2006.01) |
| *H03M 7/30* | (2006.01) |
| *H03M 1/76* | (2006.01) |
| *H03M 1/00* | (2006.01) |

(Continued)

(52) U.S. Cl.
CPC ............ *H03M 1/66* (2013.01); *G09G 3/2007* (2013.01); *H03M 1/76* (2013.01); *H03M 7/30* (2013.01); *G09G 2310/027* (2013.01); *G09G 2320/0276* (2013.01); *H03M 1/00* (2013.01); *H03M 1/747* (2013.01); *H03M 1/785* (2013.01)

(58) Field of Classification Search
CPC ........ H03M 1/747; H03M 1/00; H03M 1/785; G09G 2320/0276; G09G 2320/021; G09G 3/3688
USPC ........ 341/144, 145, 154; 345/690, 212, 211, 345/100
See application file for complete search history.

(56) References Cited

U.S. PATENT DOCUMENTS

| | | | |
|---|---|---|---|
| 6,965,337 B1* | 11/2005 | Bhattacharjee | ...... H03K 5/2481 341/144 |
| 2010/0207967 A1 | 8/2010 | Baek et al. | |

(Continued)

*Primary Examiner* — Joseph J Lauture
(74) *Attorney, Agent, or Firm* — Paratus Law Group, PLLC

(57) ABSTRACT

A digital-to-analog converter including a resistor string configured to provide a plurality of gradation voltages formed by receiving a top voltage at one end thereof and a bottom voltage at the other end; a plurality of pass transistors including a pass transistor having one end which is electrically connected to the resistor string and outputting any one among the plurality of gradation voltages; and a decoder configured to control the plurality of pass transistors. The plurality of the pass transistors are included in any one among a plurality of groups according to values of the gradation voltages, and the pass transistors included in the any one group are divided into a first group and a second group according to output gradation voltages, and pass transistors included in the first group and pass transistors included in the second group are different types of pass transistors.

11 Claims, 10 Drawing Sheets

(51) Int. Cl.
  *H03M 1/74* (2006.01)
  *H03M 1/78* (2006.01)

(56) References Cited

U.S. PATENT DOCUMENTS

2011/0205218 A1* 8/2011 Tsuchi ................ G09G 3/3283
                                                      345/212
2013/0222169 A1* 8/2013 Suzuki .................... H03M 1/68
                                                      341/154

* cited by examiner

DIGITAL-TO-ANALOG CONVERTER AND SOURCE DRIVER USING THE SAME

CROSS-REFERENCE TO RELATED APPLICATION APPLICATIONS

This application is a Continuation of U.S. patent application Ser. No. 15/464,986 filed on Mar. 21, 2017, which claims priority to Korean Patent Application No. 10-2016-0033576, filed on Mar. 21, 2016, which are all hereby incorporated herein by reference in their entirety.

BACKGROUND

1. Field of the Invention

The present invention relates to a digital-to-analog converter and a source driver using the same.

2. Discussion of Related Art

Nowadays, most electronic devices such as mobile phones, computers, and display devices are implemented with a silicon-based complementary metal oxide semiconductor (CMOS) circuit. The CMOS circuit includes a P-type MOS (PMOS) device, which is turned on when a voltage which is a threshold voltage or less is applied to a gate electrode thereof, and an N-type MOS (NMOS) device, which is turned on when a voltage which is a threshold voltage or more is applied thereto, and a circuit in which the PMOS device and the NMOS device are complementarily operated with each other is configured.

SUMMARY OF THE INVENTION

Generally, a gate driver, a timing controller, and a source driver for driving a display are implemented as a silicon-based complementary metal oxide semiconductor (CMOS) circuit. The CMOS circuit is configured as an N-type MOS (NMOS) device and a P-type MOS (PMOS) device which are complementarily operated with each other, and should have at least an enduring voltage in which the device is not destroyed by a voltage difference between a driving voltage and a ground voltage which are provided in order to perform a desired function. A device having a great enduring voltage has a great area in a substrate by having great channel length and width when compared with a device having a small enduring voltage. As an example, a digital logic circuit operates at 1.2V or less and has a channel length of tens of nanometers (nm). On the other hand, a channel length of a device operating in a voltage range of 3V is about 0.35 µm, and a channel length of a device operating in a voltage range of 8 v is close to about 1.2 µm.

Gradation voltages generated as gamma voltages inside a source driver chip have a signal amplitude which is several volts or more, and have fine gradation values of a small level corresponding to an input digital signal. Generally, in an 8-bit source driver which is mostly used, a total of 256 gradation values are present, and as an example, when an upper limit and a lower limit of the gradation voltages are respectively 10V and 2V, an average difference between adjacent gradation values is about 32 mV. An interval between substantially adjacent gradation values is not linear due to a gamma curve thereof.

A digital-to-analog converter (DAC) used in an input unit of each source driver channel is designed to be suitable to a maximum operating voltage. For example, in this case, the DAC is implemented using a device capable of enduring 10V, and as described above, there is a problem in which an area of the source driver chip is increased since a size of a device operating at a high voltage is great.

According to one aspect of the present invention, there is provided a DAC, including: a resistor string configured to provide a plurality of gradation voltages formed by receiving a top voltage at one end thereof and a bottom voltage at the other end; a plurality of pass transistors including a pass transistor having one end which is electrically connected to the resistor string and outputting any one among the plurality of gradation voltages; and a decoder configured to control the plurality of pass transistors, wherein the plurality of the pass transistors are included in any one among a plurality of groups according to values of the gradation voltages, the pass transistors included in the any one group are divided into a first group and a second group according to output gradation voltages, and pass transistors included in the first group and pass transistors included in the second group are different types of pass transistors.

According to another aspect of the present invention, there is provided a DAC, including: a resistor string configured to provide a plurality of gradation voltages formed by receiving a top voltage at one end thereof and a bottom voltage at the other end; a plurality of pass transistors including a pass transistor having one end which is electrically connected to the resistor string and outputting any one among the plurality of gradation voltages; and a decoder configured to control the plurality of pass transistors, wherein the plurality of the pass transistors are included in any one group of a plurality of groups according to values of the gradation voltages, and the pass transistors included in the same group have the same type.

According to still another aspect of the present invention, there is provided a DAC providing an analog signal corresponding to input digital information, including: a resistor string configured to provide a plurality of gradation voltages formed by receiving a top voltage at one end thereof and a bottom voltage at the other end; a plurality of pass transistors configured to output any one among the plurality of gradation voltages, and arranged in a plurality of groups according to output gradation voltages; and a decoder configured to control the plurality of pass transistors, wherein the decoder forms a plurality of control signals that swings between an upper limit voltage and a lower limit voltage, which are different for each group and control the plurality of pass transistors.

According to yet another aspect of the present invention, there is provided a source driver, including: a DAC including a decoder which receives a digital signal, a resistor string which provides a plurality of gradation voltages, and a plurality of pass transistors which output a gradation voltage corresponding to the digital signal; and a buffer amplifier configured to providing an amplified gradation voltage by amplifying the gradation voltage output from the DAC, wherein the plurality of pass transistors are included in any one among a plurality of groups according to output gradation voltages, and the number of pass transistors included in the groups are not expressed as a power of 2.

According to yet another aspect of the present invention, there is provided a source driver, including: a DAC including a decoder which receives a digital signal, a resistor string which provides a plurality of gradation voltages, and a plurality of pass transistors which output a gradation voltage corresponding to the digital signal; and a buffer amplifier configured to providing an amplified gradation voltage by amplifying the gradation voltage output from the DAC, wherein the plurality of pass transistors are included in any one among a plurality of groups according to output gradation voltages, and the number of pass transistors included in each group are expressed as a power of 2.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
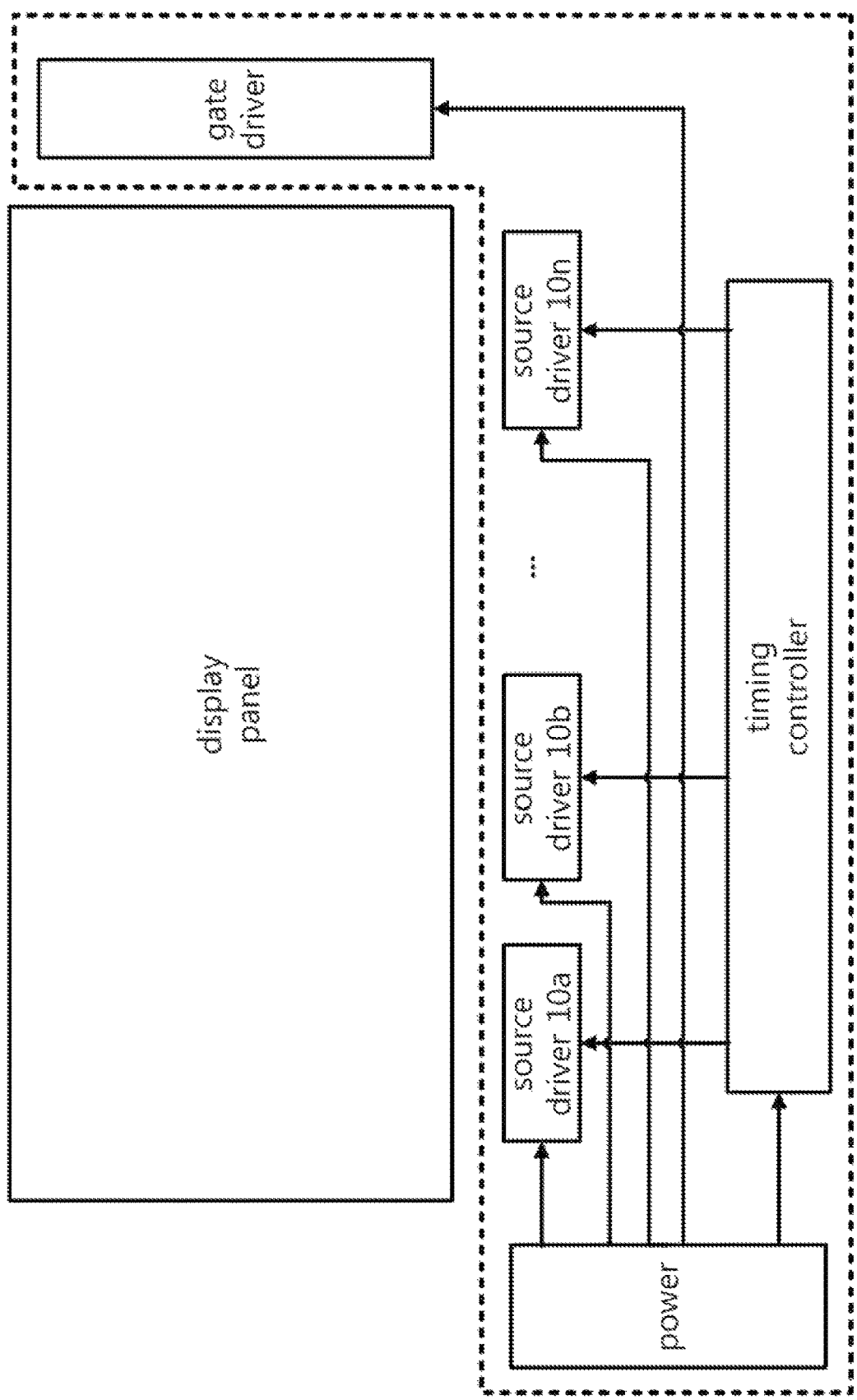
FIG. 1 is a schematic diagram illustrating a configuration of a display system.

Since a description related to the present invention is merely for structurally or functionally explaining embodiments, it should be understood that the scope of the present invention is not limited by the embodiments described in the specification. That is, since the embodiments of the present invention are variously changeable and may have various forms, it should be understood that the scope of the present invention includes equivalents capable of implementing the technical spirit of the present invention.

Meanwhile, meanings of the terms described in the specification should be understood as follows.

Although the terms first, second, etc. may be used herein in order to differentiate one element from another element, the scope of the present invention is not to be construed as limited by these terms. For example, a first element could be termed a second element, and similarly, a second element could be termed a first element.

The articles "a," "an," and "the" are singular in that they have a single referent, however the use of the singular form in the present document does not preclude the presence of more than one referent. It should be further understood that the terms "comprises," "comprising," "includes," and/or "including," when used herein, specify the presence of stated features, items, steps, operations, elements, components and/or groups thereof, but do not preclude the presence or addition of one or more other features, items, steps, operations, elements, components, and/or groups thereof.

The term "and/or" used herein to describe embodiments of the present invention may be used to referring to each and all elements of a corresponding list. As an example, it should be understood that the terms "A and/or B" refers to each of A and B and all of A and B.

In order to describe embodiments of the present invention, a size, height, thickness, or the like thereof may be intentionally exaggerated in the accompanying drawings for convenience of explanation, and such alterations may not be made according to a ratio. Further, one element shown in the accompanying drawing may be expressed by being intentionally reduced, and another element may be expressed by being intentionally enlarged.

Unless otherwise defined, all terms used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art, and this specification and are not to be interpreted in an idealized or overly formal sense unless expressly so defined herein.

In describing embodiments of the present invention, when it is determined that a plurality of elements that perform the same or similar functions need to be distinguished, symbols such as a, b, and c or 1, 2, and 3 are added, but when it is not necessary to distinguish the plurality of elements or it is desired to describe all of the elements, it may be possible to describe the elements by removing reference numerals.

Hereinafter, embodiments of the present invention will be described with reference to the accompanying drawings. FIG. 1 is a schematic diagram illustrating a configuration of a display system. Referring to FIG. 1, a display system according to an embodiment of the present invention may include a display panel, a gate driver, and source drivers 10a, 10b, . . . , and 10n, and may also include a timing controller which changes a characteristic of a screen source applied from the outside or controls a driving time according to a resolution and a characteristic of the display system. The timing controller and the source driver 10a, 10b, . . . , and 10n may be implemented as separate chips according to the characteristic of the display panel, or as one chip as shown in the drawing.

Figure 2:
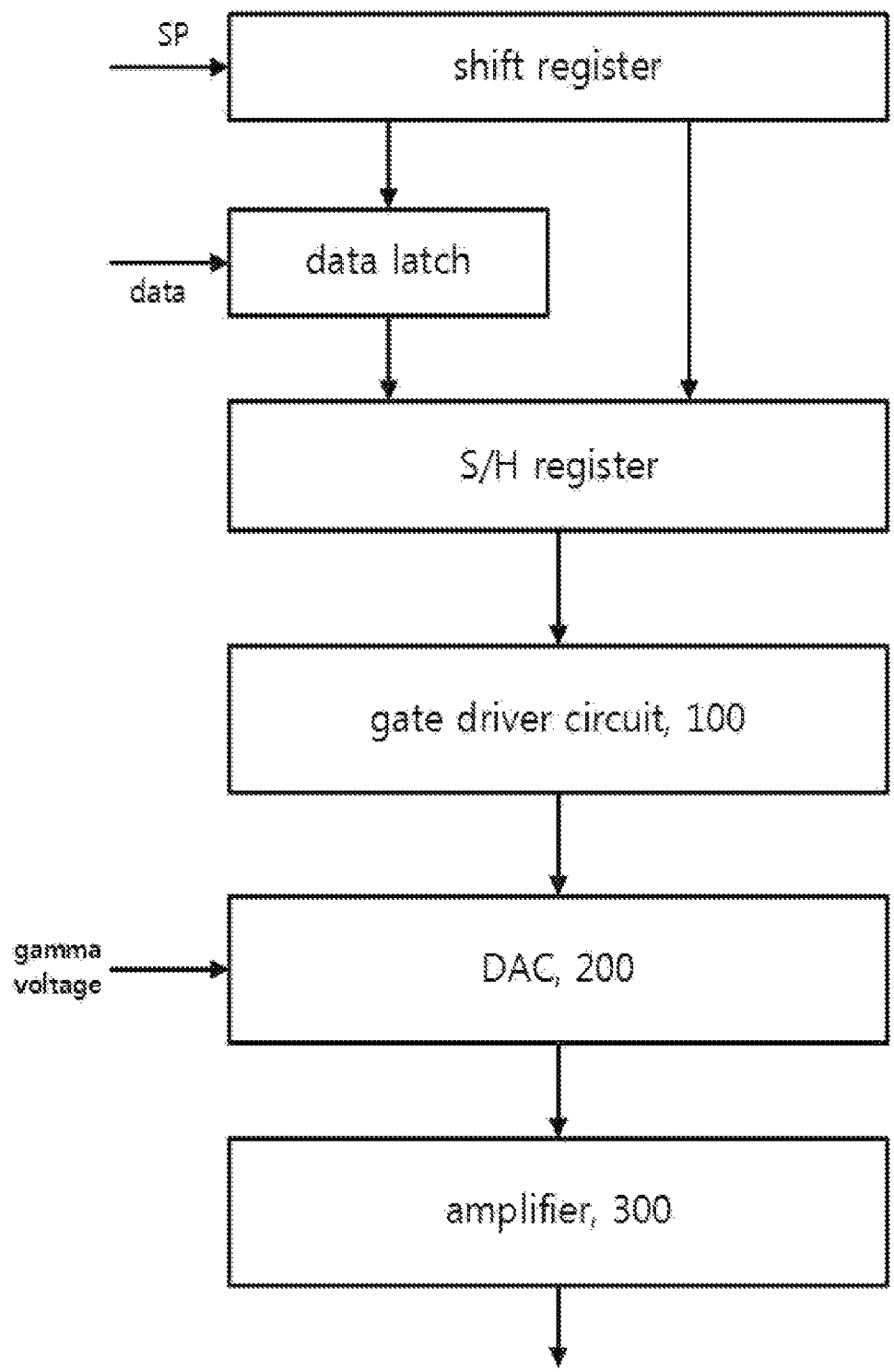
FIG. 2 is a schematic block diagram illustrating a source driver according to an embodiment of the present invention.

FIG. 2 is a schematic block diagram illustrating a source driver 10 according to an embodiment of the present invention. Referring to FIG. 2, the source driver 10 may include a shift resistor, a data latch, a sample/hold (S/H) resistor, a gate driver circuit 100, a digital-to-analog converter (DAC) 200, and an amplifier 300. As an example, the amplifier 300 may be a buffer having unity gain.

The shift resistor may sequentially shift and output an input start pulse SP. The data latch may latch up and provide image data, and the S/H resistor may sample the latched-up image data according to the start pulse SP and hold the sampled data to provide the sampled data to the gate driver circuit 100.

The gate driver circuit 100 may receive digital bits and provide output signals that swing between an upper limit voltage and a lower limit voltage, which are different from each other. As an example, the DAC 200 may receive a gamma voltage and convert an output signal provided from the gate driver circuit 100 into an analog signal to provide the analog signal to the amplifier 300, and the amplifier 300 may amplify the analog signal and provide the amplified analog signal to the display panel so that an image corresponding to input data is displayed. As another example, the DAC 200 may receive a voltage in which an upper headroom voltage is added to an upper limit value of the gamma voltage as an upper limit voltage, and receive a voltage in which a lower headroom voltage is subtracted from a lower limit value of the gamma voltage as a lower limit voltage.

Figure 3:
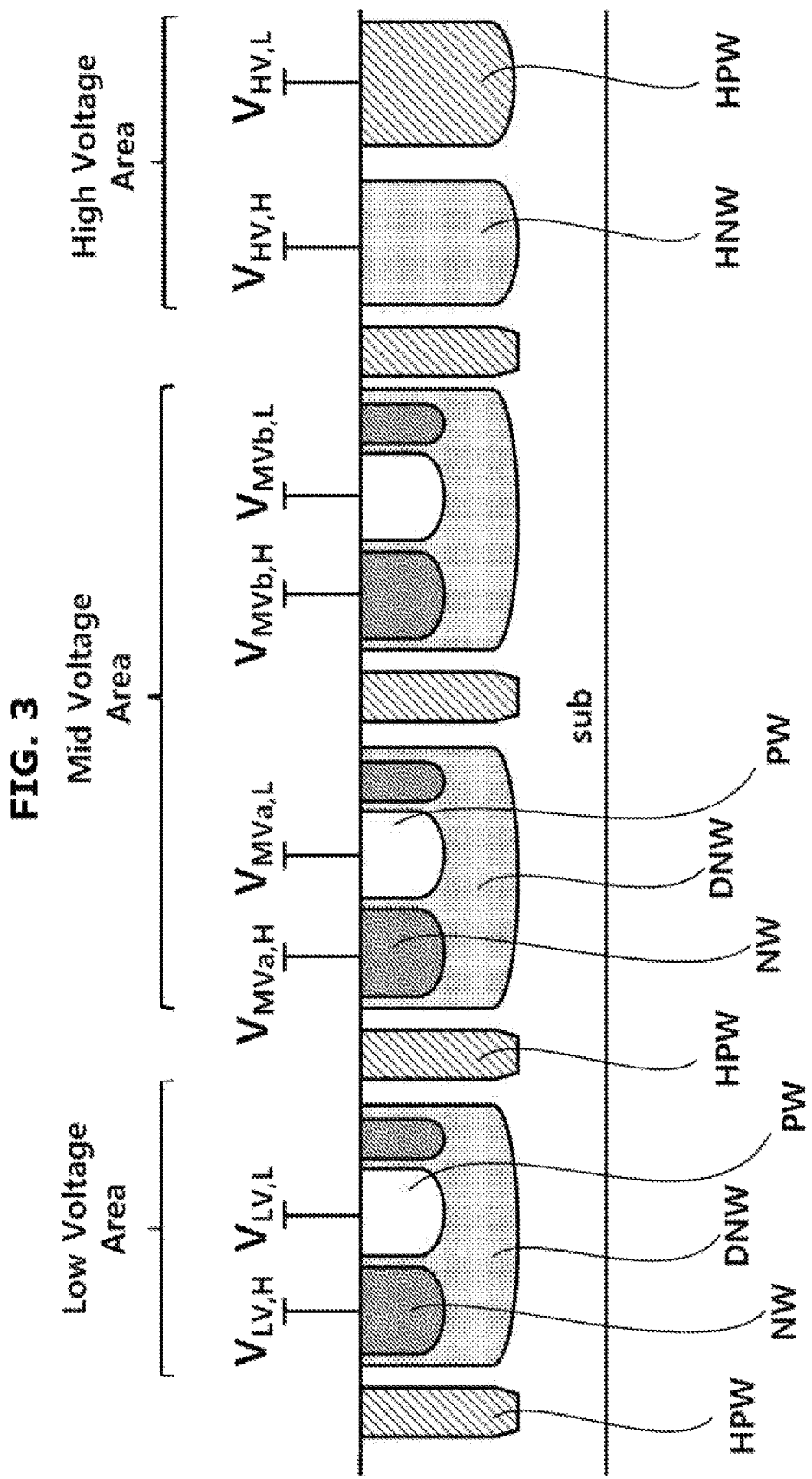
FIG. 3 is a schematic diagram illustrating a cross-sectional view of a silicon substrate in which a source driver according to an embodiment of the present invention is formed.

FIG. 3 is a schematic diagram illustrating a cross-sectional view of a silicon substrate in which a source driver according to an embodiment of the present invention is formed. The source driver 10 may be formed in a semiconductor substrate sub. According to an example shown in FIG. 3, the semiconductor substrate sub may be doped by a P-type dopant. The semiconductor substrate may be divided into a plurality of areas such as a low voltage area, a high voltage area, and a middle voltage area according to a voltage range in which a circuit located in a corresponding area is driven and/or a voltage range of an input signal and an output signal thereof. As an example, circuits operating at a relatively low voltage such as a digital circuit or the like may be formed in the low voltage area. A power unit (refer to power in FIG. 1) which supplies power to a circuit and a level shifter used for a gate driver circuit may be formed in the high voltage area, and circuits operating in the middle voltage area between the low voltage area and the high voltage area may be arranged in the middle voltage area. As an example, the gate driver circuit (refer to 100 in FIG. 2) which receives image data which is a digital signal provided from digital circuits arranged in the low voltage area and shifts a level of the signal to be a sufficient voltage which is able to drive the DAC, the DAC (refer to 200 in FIG. 2) which is driven by the gate driver circuit and forms a gradation voltage corresponding to the image data, and the amplifier 300 may be arranged in the middle voltage area.

The low voltage area and the middle voltage area may be formed to have a triple well structure. The triple well structure may include a deep N-well (DNW) formed in a P-type substrate, an N well (NW) in which a P-type metal oxide semiconductor (PMOS) transistor is arranged in the DNW, and a P well (PW) in which an N-type MOS (NMOS) transistor is arranged. According to an embodiment of the triple well, which is not shown, the triple well structure may have a structure in which the PW is formed in the DNW and the NW, in which the PMOS transistor is arranged, is formed in the PW.

A driving voltage which is less than a driving voltage provided to the high voltage area and the middle voltage area may be supplied to a circuit arranged in the low voltage area. According to the embodiment shown in FIG. 3, a circuit driven by a pair of low driving voltages $V_{LVa,H}$ and $V_{LVa,L}$ may be arranged in the low voltage area. The NW and the PW in an area in which the circuit driven by the pair of low driving voltages $V_{LVa,H}$ and $V_{LVa,L}$ is arranged may be respectively biased by the pair of low driving voltages $V_{LVa,H}$ and $V_{LVa,L}$. As an example, the pair of low driving voltage $V_{LVa,H}$ and $V_{LVa,L}$ may respectively be 1.2V and 0V. As another example, the pair of low driving voltage $V_{LVa,H}$ and $V_{LVa,L}$ may respectively be 1.8V and 0V. According to another embodiment, which is not shown, a plurality of areas in which a circuit driven by a plurality of pairs of low driving voltage is arranged may be located in the low voltage area.

A high voltage N well (HNW) and a high voltage P well (HPW) may be arranged in the high voltage area. PMOS devices and NMOS devices formed to have a great area by having a greater channel length and width than devices arranged in the low voltage area may be arranged in the HNW and the HPW so as not to be destroyed at a high voltage. High voltage driving voltages $V_{HV,H}$ and $V_{HV,L}$ may be respectively provided in the HNW and the HPW included in the high voltage area. As an example, the high voltage driving voltages $V_{HV,H}$ and $V_{HV,L}$ may respectively be 10V and −10V.

The middle voltage area may have a triple well structure, and a PMOS device and an NMOS device may be respectively arranged in an NW and a PW included in the triple well structure. According to an embodiment of FIG. 3, the middle voltage area may include an area in which an NW and a PW to which first middle voltages $V_{MVa,H}$ and $V_{MVa,L}$ are provided are arranged, and an area in which an NW and a PW to which second middle voltages $V_{MVb,H}$ and $V_{MVb,L}$ are provided are arranged.

Figure 4:
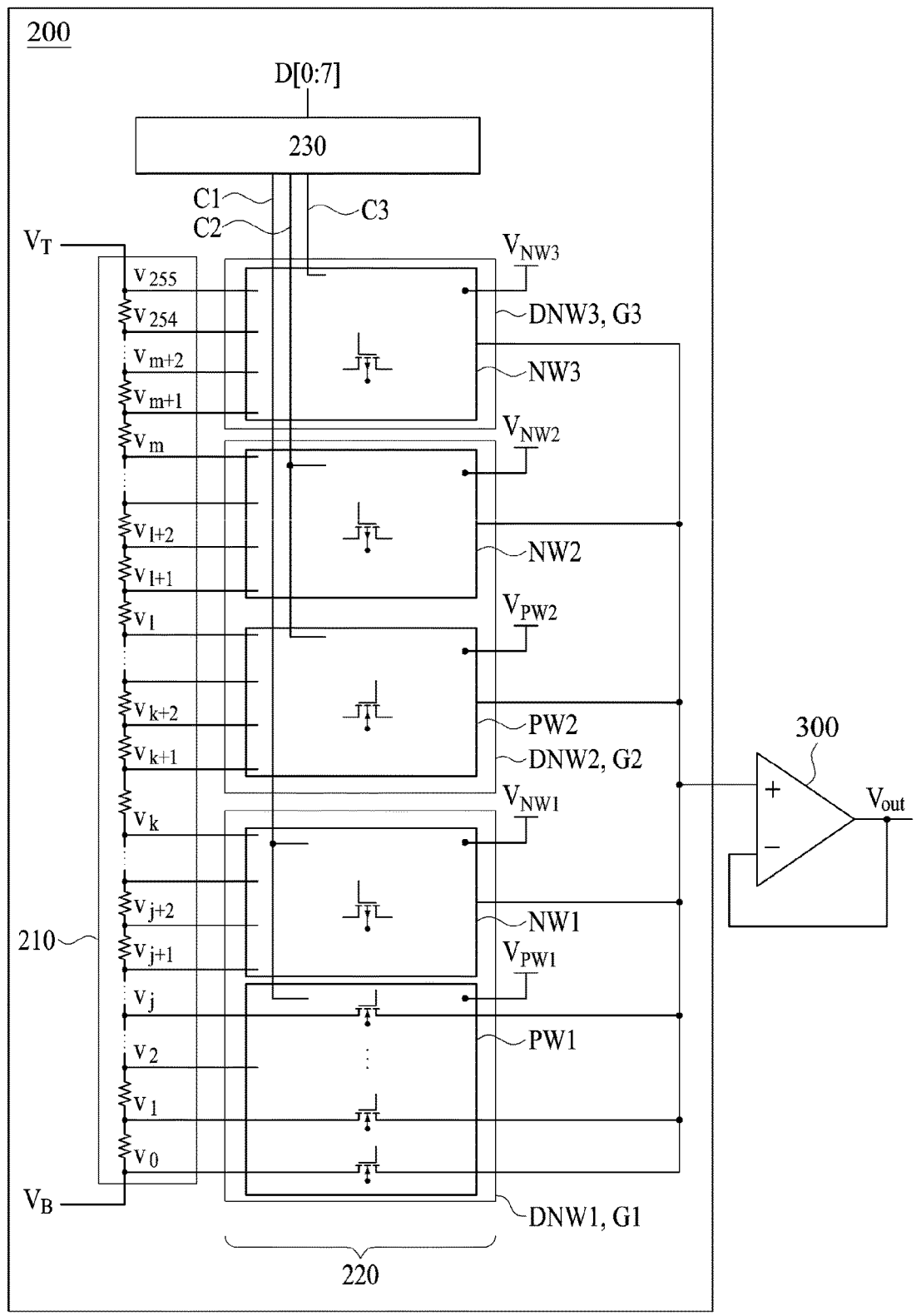
FIG. 4 is a schematic diagram for describing a digital-to-analog converter (DAC) according to one embodiment of the present invention.
Figure 5:
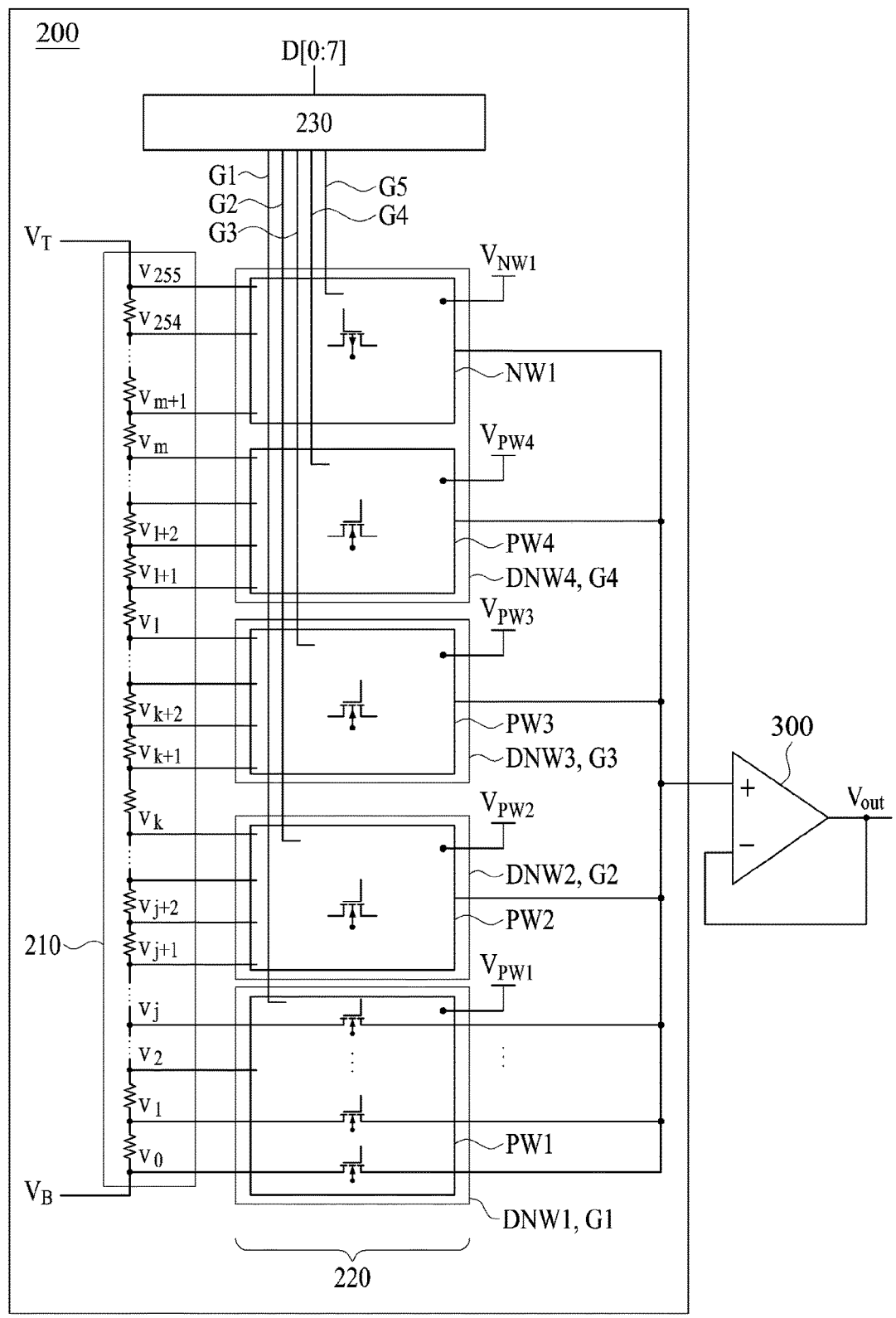
FIG. 5 is an exemplary circuit diagram illustrating a DAC according to another embodiment of the present invention.

FIG. 4 is a schematic diagram for describing the DAC 200 according to an embodiment of the present invention. Although FIGS. 4 and 5 illustrate a configuration in which the DAC 200 receives an 8-bit digital input D[0:7] and outputs any one gradation signal corresponding to the digital input among 256 gradation voltages $v_0$, $v_1$, ..., and $v_{255}$, this is merely an example for providing a clear explanation and is not intended to limit the technical scope of the present invention.

Referring to FIG. 4, the DAC 200 according to an embodiment of the present invention may include a resistor string 210 that receives a top voltage $V_T$ provided through one end and a bottom voltage $V_B$ provided through the other end and provides a plurality of gradation voltages, a plurality of pass transistors 220 including a pass transistor having one end which is electrically connected to the resistor string and outputs any one among the plurality of gradation voltages, and a decoder 230 controlling the plurality of pass transistors 220, and the plurality of pass transistors 220 may be included in any one among a plurality of groups according to output values of the gradation voltages.

In the embodiment shown in FIG. 4, an example in which the bottom voltage $V_B$ is provided as $v_0$, which is the smallest gradation voltage, is illustrated, but one or more resistors may be present between a node to which the bottom voltage $V_B$ is provided and a node to which the smallest gradation voltage $v_0$ is provided so that values of the bottom voltage $V_B$ and the smallest gradation voltage $v_0$ may differ. Further, an example in which the top voltage $V_T$ is provided as $v_{255}$, which is the greatest gradation voltage is illustrated, but values of the top voltage $V_T$ and the greatest gradation voltage $v_{255}$ may differ.

The resistor string 210 may include a plurality of resistors which are interconnected, the top voltage $V_T$ may be provided to the one end of the resistor string 210, and the bottom voltage $V_B$ may be provided to the other end. The resistor string 210 may provide voltages formed by the top voltage $V_T$ and the bottom voltage $V_B$ being divided as the gradation voltages $v_0$, $v_1$, ..., and $v_{255}$.

In an embodiment, voltage differences of adjacent gradation voltages may be the same in the gradation voltages $v_0$, $v_1$, ..., and $v_{255}$ formed by the plurality of resistors which are interconnected. For example, when the top voltage $V_P$ is 7.5V and the bottom voltage $V_B$ is 0.5V, a 7V voltage difference may be formed between the one end and the other end of the resistor string 210, and a voltage difference of about 27.45 mV may be formed between the adjacent gradation voltages.

As another embodiment, the voltage differences of the gradation voltages provided by the resistor string 210 may be different. Brightness of a pixel included in a display panel and a voltage provided to the pixel may have a non-linear relationship according to a characteristic of the display panel. Accordingly, in order to control the brightness of the pixel and the gradation voltages, an interval between the gradation voltages may be less than 27.45 mV in the high voltage area, and an interval between the gradation voltages may be greater than 27.45 mV in the low voltage area.

The gradation voltages $v_0$, $v_1$, ..., and $v_{255}$ may be respectively provided to one ends of the pass transistors 220, and each of the pass transistors 220 may be controlled by a control signal provided from the decoder 230 and output or block the gradation voltages provided to the one end thereof. The pass transistors 220 may be located by being grouped according to the gradation voltages, and pass transistors included in the same group may be arranged in the same well. An example in which a single NMOS transistor is used in a PW1 shown in FIG. 4 is illustrated, but this is merely an example, and one gradation voltage may be output using a plurality of pass transistors which are connected in series, in parallel, or in parallel series.

The decoder 230 may receive the digital signal D[0:7], shift and decode a level of the digital signal into a sufficient level which is able to drive the pass transistors, and provide a signal for controlling the pass transistors. As an example, the decoder 230 may provide any one among signals swinging between the upper limit voltage and the lower limit voltage, which are different according to a pass transistor which is desired to be driven, to the gate electrode of the pass transistors, and control the pass transistors.

In the embodiment shown in FIG. 4, the plurality of gradation voltages may be divided into a plurality of groups G1, G2, and G3, a plurality of gradation voltages included in each group may be further divided into a high voltage group and a low voltage group, gradation voltages included in the high voltage group may be output to the PMOS pass transistors arranged in the NW, and gradation voltages included in the low voltage group may be output to the NMOS pass transistors arranged in the PW.

As an embodiment, it may be advantageous to arrange the remaining gradation voltages which are not divided into the low voltage group and the high voltage group after dividing the gradation voltages into the plurality of groups from into one group the viewpoint of die area. In this case, pass transistors outputting the remaining gradation voltages may be arranged in one well. As an example, as shown in FIG. 4, when gradation voltages $v_o$ to $v_m$ are divided into two groups G1 and G2 according to values of the gradation voltages, and each of the groups is divided into a high voltage group and a low voltage group, the remaining gradation voltages $v_{m+1}$ to $v_{255}$ may not be suitable for division into the high voltage group and the low voltage group since the number of the remaining gradation voltages $v_{m+1}$ to $v_{255}$ is small. In this case, as shown, the remaining gradation voltages $v_{m+1}$ to $v_{255}$ may be configured to be provided to PMOS pass transistors arranged in an NW3, which is one well.

As another example, which is not shown, the gradation voltages $v_{m+1}$ to $v_{255}$ may be divided into the two groups G1 and G2, each of the groups is divided into a high voltage group and a low voltage group, and the remaining gradation voltages $v_0$ to $v_m$ may be provided to the NMOS pass transistors arranged in the PW1.

In the embodiment shown in FIG. 4, the gradation voltage group G1 having gradation voltages $v_0$ to $v_k$ may be divided into a low voltage group having gradation voltages $v_0$ to $v_j$ and a high voltage group having gradation voltages $v_{j+1}$ to $v_k$, the gradation voltages included in the low voltage group may be output by the NMOS pass transistors arranged in the PW1, and the gradation voltages included in the high voltage group may be output by the PMOS pass transistors arranged in an NW1. The gradation voltage group G2 having gradation voltages $v_{k+1}$ to $v_m$ may be divided into a low voltage group having gradation voltages $v_{k+1}$ to $v_l$ and a high voltage group having gradation voltages $v_{l+1}$ to $v_m$, the gradation voltages included in the low voltage group may be output by the NMOS pass transistors arranged in a PW2, and the gradation voltages included in the high voltage group may be output by the PMOS pass transistors arranged in an NW2. A maximum gradation voltage among gradation voltages included in one gradation voltage group may be provided as a well bias voltage of the NW, and a minimum gradation voltage may be provided as a well bias voltage of the PW.

When it is not desirable to divide a remaining gradation voltage group G3 having the remaining gradation voltages $v_{m+1}$ to $v_{255}$ into the low voltage group and the high voltage group from the viewpoint of die size, the remaining gradation voltages $v_{m+1}$ to $v_{255}$ may be configured to be output to the PMOS pass transistors arranged in the NW3. Further, $v_{255}$, which is the greatest gradation voltage, may be provides as a well bias voltage of the NW3.

The NW1, in which the pass transistors providing the gradation voltages $v_0$ to $v_j$ are arranged, and the PW1, in which the pass transistors providing the gradation voltages $v_{j+1}$ to $v_k$ are arranged, may be included in the same DNW1. An interval between different deep wells thereof may be greater than that between the NW and the PW. Accordingly, when forming the NW and the PW in the same deep well, there may be no effect on an operation of a device, and a die size may be more decreased than when forming the NW and the PW in different deep wells. The NW1 may be biased by a well bias voltage $V_{NW1}$, body electrodes of the PMOS transistors arranged in the NW1 may be electrically connected to the NW1, and the well bias voltage $V_{NW1}$ may be provided to the body electrodes of the PMOS transistors. The PW1 may be biased by a well bias voltage $V_{PW1}$, body electrodes of the NMOS transistors arranged in the PW1 may be electrically connected to the PW1, and the well bias voltage $V_{PW1}$ may be provided to the body electrodes of the NMOS transistors.

A well bias voltage $V_{PW2}$ may be provided to the PW2 in which the pass transistors providing the gradation voltages $v_{k+1}$ to $v_l$ are arranged, and may be provided to body electrodes of the NMOS transistors arranged in the PW2. A well bias voltage $V_{NW2}$ may be provided to the NW2 in which the pass transistors providing the gradation voltage $v_{l+1}$ to $v_m$ are arranged, and may be provided to the body electrodes of the PMOS transistors arranged in the NW2. A well bias voltage $V_{NW3}$ may be provided to the NW3 in which the pass transistors providing the gradation voltages $v_{m+1}$ to $v_{255}$ are arranged, and may be provided to body electrodes of the PMOS transistors arranged in the NW3.

The pass transistors providing the gradation voltages $v_{m+1}$ to $v_{255}$ may be PMOS pass transistors and arranged in the NW3, and the well bias voltage $V_{NW3}$ may be provided to the NW3, and may be provided to the body electrodes of the PMOS transistors arranged in the NW3. The NW3 may be formed in the DNW3. According to another embodiment, which is not shown, the gradation voltages $v_{m+1}$ to $v_{255}$ may be provided using the NMOS pass transistors, but there may be a problem in which an additional circuit has to be formed using a device of a great size having a great enduring voltage to form high voltage since a voltage, which is greater by at least a threshold voltage than the greatest gradation voltage, should be provided to gate electrodes in order to control the pass transistors.

In the embodiment described above, the pass transistors providing the gradation voltages $v_0$ to $v_m$ may be divided into different groups, each of the groups may be arranged in a deep well, and the pass transistors providing the remaining gradation voltages $v_{m+1}$ to $v_{255}$ may be arranged in one deep well, but in an embodiment, which is not shown, the pass transistors providing the gradation voltages $v_{j+1}$ to $v_{255}$ may be grouped, and be arranged in different deep wells, but the pass transistors providing the gradation voltages $v_0$ to $v_j$ may be formed using NMOS pass transistors, may be arranged in the same deep well, and may be arranged in the PW formed in the deep well. When forming the pass transistors providing the gradation voltages $v_0$ to $v_j$ using the NMOS pass transistors, it may be suitable for a voltage which is greater by at least the threshold voltage than the maximum gradation voltage to be provided to turn on the pass transistors, and there may be a problem in which an additional circuit for forming a voltage which is less than the bottom voltage $V_B$ is needed when forming the pass transistors using PMOS pass transistors.

In an embodiment, the PW and the NW formed in the same deep well may be respectively biased by the maximum gradation voltage and the minimum gradation voltage provided by the pass transistors arranged in the same deep well. As an example, the well bias voltage $V_{PW1}$ provided to the PW1 may be $v_0$, which is the smallest gradation voltage among the gradation voltages provided by the pass transistors arranged in the DNW1, the well bias voltage $V_{NW1}$ provided to the NW1 may be $v_k$, which is the maximum gradation voltage among the gradation voltages provided by the pass transistors arranged in the DNW1. The well bias voltages $V_{PW2}$ and $V_{NW2}$ provided to the PW2 and the NW2 formed in the DNW2 may respectively be $v_{k+1}$ and $v_m$, and the well bias voltage $V_{NW3}$ provided to the NW3 formed in the DNW3 may be $v_{255}$. In an embodiment, the DNW1, DNW2, and DNW3 may be biased by the well bias voltage provided to the NW formed in the each of the deep wells.

In one embodiment, the well bias voltages may be provided by a separate power source for providing the well bias voltages. In another embodiment, the well bias voltages may be provided by a buffer amplifier by buffering a gradation voltage from the resistor string.

An operation of the DAC will be described. As an example, assume that $v_0$ is 0.5V, $v_j$ is 1.5V, $v_{j+1}$ is 1.527V, $v_k$ is 3V, $v_{k+1}$ is 3.027V, $v_l$ is 4.5V, $v_{l+1}$ is 4.527V, $v_m$ is 6V, $v_{m+1}$ is 6.027V, and $v_{255}$ is 7.5V. $V_{PW1}$ may be 0.5V, which is $v_0$, $V_{NW1}$ may be 3V, which is $v_k$, $V_{PW2}$ may be 3.027V, which is $v_{k+1}$, $V_{NW2}$ may be 6V, which is $v_m$, and $V_{NW3}$ may be 7.5V, which is $v_{255}$. Further, an example in which all of the pass transistors arranged in the DNW1, DNW2, and DNW3 are implemented using devices in which a voltage difference between electrodes is a 3V enduring voltage is illustrated, but it is assumed that a threshold voltage of an NMOS pass transistor is 0.3V and a threshold voltage of a PMOS transistor is −0.3V.

The maximum gradation voltage and the minimum gradation voltage of the gradation voltages included in the same gradation group may respectively be provided as the well bias voltages of the NW and the PW, and the pass transistors arranged in the deep well may be controlled by providing a control signal that swings between the maximum gradation voltage and the minimum gradation voltage of the gradation voltages.

As an example, the NMOS pass transistors arranged in the PW1 and the PMOS pass transistors arranged in the NW1 may be controlled by the control signal C1 swinging between 0.5V, which is a value of the smallest gradation voltage $v_0$, and 3V, which is a value of the maximum gradation voltage $v_k$, provided by the pass transistors arranged in the DNW1 including the PW1. When 3V is provided to a gate electrode of the NMOS pass transistor providing the gradation voltage $v_j$, a gate-source voltage may be formed as 3V−1.5V=1.5V, and the NMOS pass transistor may be turned on since the gate-source voltage is greater than the threshold voltage. 1.2V, which is greater than 0.3V, which is the threshold voltage, may be an overdriving voltage, and a turn-on resistance characteristic between a drain electrode and a source electrode of the NMOS pass transistor may be improved by the NMOS pass transistor being overdriven. On the other hand, when 0.5V is provided to the gate electrode of the same NMOS pass transistor, the gate-source voltage may be 0.5V−1.5V=−1.0V, and the NMOS pass transistor may be turned off since the gate-source voltage is less than the threshold voltage.

When 3V is provided to a gate electrode of the PMOS pass transistor providing the gradation voltage $v_{j+1}$, the gate-source voltage may be 3V−1.527V=1.473V, and the PMOS pass transistor may be turned off since the gate-source voltage is greater than −0.3V, which is the threshold voltage. When 0.5V is provided to the gate electrode of the same PMOS pass transistor, the gate-source voltage may be 0.5V−1.527V=−1.027V, and the PMOS pass transistor may be turned on since the gate-source voltage is smaller than −0.3V, which is the threshold voltage. −0.727V, which is a difference between the gate-source voltage and the threshold voltage, may be an overdriving voltage which overdrives the PMOS transistor, and a characteristic of a device may be improved by decreasing a turn-on resistance between a drain electrode and a source electrode of the PMOS transistor.

6V, which is the maximum gradation voltage $v_m$, and 3.027V, which is the minimum gradation voltage $v_{k+1}$ among the gradation voltages provided by the pass transistors arranged in the DNW2, may respectively be provided to the NW2 and the PW2 formed in the DNW2 as to the well bias voltages. The decoder may provide a control signal C2 that swings between 3.027V and 6V to the pass transistors arranged in the DNW2 to control the pass transistors. When a 3.027V control signal is provided to a gate electrode of the NMOS transistor providing the gradation voltage $v_{k+1}$, the gate-source voltage may be 3.027V−3.027V=0, and the NMOS transistor may be turned off since the gate-source voltage is less than the threshold voltage. However, when a 6V control signal is provided to the gate electrode of the NMOS transistor, the gate-source voltage may be 6V−3.027V=2.973V, and the NMOS transistor may be turned on since the gate-source voltage is greater than the threshold voltage. As described above, a voltage which is greater than the threshold voltage may be an overdriving voltage which overdrives the NMOS transistor, and a turn-on characteristic of the pass transistor may be improved.

When 3.027V, which is the minimum voltage of the control signal C2, is provided to a gate electrode of the PMOS pass transistor providing the gradation voltage $v_m$, the gate-source voltage of the PMOS transistor may be 3.027V−6V=−2.973V, the PMOS transistor may be turned on since the gate-source voltage is less than the threshold voltage. As described above, a voltage which is smaller than the threshold may be an overdriving voltage which overdrives the PMOS transistor, and the turn-on characteristic of the pass transistor may be improved by the overdriving voltage. However, when the 6V control signal is provided to the gate electrode of the PMOS transistor, the gate-source voltage may be 6V−6V=0, and the PMOS transistor may be turned off since the gate source voltage is greater than the threshold voltage.

7.5V, which is the greatest gradation voltage $v_{255}$ among the gradation voltages provided by the pass transistors arranged in the DNW3, may be provided to the NW3 formed in the DNW3 as the well bias voltage. A control signal C3 which controls the pass transistors arranged in the DNW3 may be a signal that swings between 7.5V, which is the well bias voltage of the NW3, and a voltage which is less by at least the threshold voltage than the minimum gradation voltage among the gradation voltages provided by the pass transistors arranged in the NW3. As an example, the control signal C3 may be a voltage that swings between 5.727V or less, which is a voltage which is less by at least the threshold voltage than 6.027V which is the minimum gradation voltage $v_{m+1}$ among the gradation voltages provided by the pass transistors included in the NW3, and 7.5V. As an example, the control signal C3 may be a voltage that swings between a voltage which is less than 5.727V formed by adding an overdriving voltage for overdriving the pass transistors arranged in the NW3 and 7.5V.

When 7.5V, which is a maximum voltage of the control signal C3, is provided to a gate electrode of the PMOS pass transistor providing the gradation voltage $v_{m+1}$, a gate-source voltage of the PMOS pass transistor may be 7.5V−6.027V=1.473V, and the PMOS pass transistor may be turned off since the gate-source voltage is greater than the threshold voltage. However, when a voltage which is 5.727V or less, which is the minimum voltage of the control signal C3, is provided, the PMOS pass transistor may be turned on since the gate-source voltage of the PMOS pass transistor is 5.727V−6.027V=−0.3V. The decoder may provide a voltage obtained by adding a negative overdriving voltage to the minimum voltage of the control signal C3 so that the turn-on characteristic of the PMOS pass transistor may be improved.

Further, when 7.5V, which is the maximum voltage of the control signal C3, is provided to the gate electrode of the pass transistor providing the gradation voltage $v_{255}$, the gate-source voltage of the PMOS pass transistor may be 7.5V−7.5V=0V, and the PMOS pass transistor may be turned off since the gate-source voltage is greater than the threshold voltage. However, when a voltage which is less than or equal to 5.727V, which is the minimum voltage of the control signal C3, is provided, the gate-source voltage of the PMOS pass transistor is 5.727V−7.5V=−1.773V or less, which is less than −0.3V, and the PMOS pass transistor may be turned on.

That is, like the gradation voltage group G3, when the gradation voltages are not divided into the high voltage group and the low voltage group and the gradation voltages are formed to be output to the PMOS pass transistors, the decoder may control the PMOS pass transistors using the control signal that swings between a voltage in which the threshold voltage of the PMOS pass transistor and the overdriving voltage of the PMOS pass transistor are added to the minimum gradation voltage included in the gradation voltage group and the maximum gradation voltage included in the gradation voltage group. For example, assuming that the maximum gradation voltage included in the gradation voltage group is 8V, the minimum gradation voltage is 6.5V, the threshold voltage of the PMOS pass transistor −0.4V, and a target overdriving voltage is −0.6V, the decoder may control the PMOS pass transistor by providing a signal that swings between a maximum voltage of 8V and a minimum voltage of 6.5V+(−0.4V)+(−0.6V)=5.5V.

As another embodiment, which is not shown, when the gradation voltages are not divided into the high voltage group and the low voltage group and the gradation voltages are formed to be output to the NMOS pass transistors, the decoder may control the NMOS pass transistor by forming a control signal that swings between a voltage in which the threshold voltage of the NMOS pass transistor and the overdriving voltage are added to the maximum gradation voltage included in the gradation voltage group and the minimum gradation voltage included in the gradation voltage group. For example, assuming that the minimum gradation voltage included in the gradation voltage group is 0.5V, the maximum gradation voltage is 1.5V, the threshold voltage of the NMOS pass transistor 0.3V, and a target overdriving voltage is 0.6V, the decoder may control the NMOS pass transistor included in the gradation voltage group by providing a signal that swings between a minimum voltage of 0.5V and a maximum voltage of 1.5V+0.3V+0.6V=2.4V.

Like the gradation voltage groups G1 and G2, when the plurality of gradation voltages included in the gradation voltage groups G1 and G2 are divided into the high voltage group and the low voltage group, the high voltage group and the low voltage group are respectively output to the PMOS pass transistors arranged in the NW and the NMOS pass transistors arranged in the PW, and the PMOS pass transistors and the NMOS pass transistors are controlled using a control signal that swings between the well bias voltages provided to the NW and the PW, a maximum voltage difference of the electrodes formed in the pass transistors may correspond to a difference between the maximum gradation voltage and the minimum gradation voltage among the gradation voltages included in a corresponding gradation voltage group. Accordingly, when the pass transistors included in each of the gradation voltage groups are formed to have an enduring voltage corresponding to the difference between the maximum gradation voltage and the minimum gradation voltage, the pass transistors may not be destroyed by the provided voltage, and reliability of the operation may be secured.

As an example, the control signal C1 which controls the pass transistors arranged in the DNW1 may swing between 3V and 0.5V, which is the minimum voltage, and a maximum voltage difference of the electrodes formed in the pass transistors arranged in the DNW1 may be 2.5V. Since the control signal C2 which controls the pass transistors arranged in the DNW2 swings between 6V, which is the maximum gradation voltage among the gradation voltages provided by the pass transistors arranged in the DWN2, and 3.027V, which is the minimum voltage, the maximum voltage difference of the electrodes formed in the pass transistors arranged in the DWN1 may be 2.973V. Accordingly, when the pass transistors included in the DNW1 and DNW2 are formed using devices having the 3V enduring voltage, the pass transistors may not be destroyed by the provided voltage, and reliability of the operation may be secured.

Like the gradation voltage group G3, when the gradation voltages are not divided into the high voltage group and the low voltage group and the gradation voltages are formed to be output to the PMOS pass transistors, a voltage difference of the electrodes corresponding to a voltage difference between a voltage which is able to turn on the pass transistors providing the minimum gradation voltage included in the gradation voltage group and the maximum gradation voltage may be formed. As an example, when the control signal C3 swings between 7.5V, which is the voltage $v_{255}$, and 5.727V, which is the minimum voltage which is able to turn on the PMOS pass transistor providing the gradation voltage $v_{m+1}$, the voltage difference of the electrodes formed in the pass transistors arranged in the DNW3 may be 1.773V. However, when the pass transistors providing the gradation voltages are overdriven, the voltage difference of the electrodes may be increased by as much as a voltage needed for overdriving the pass transistors.

As described above, a turn-on resistance between the drain electrode and the source electrode of the pass transistor may be decreased by providing a voltage in which the overdriving voltage and the threshold voltage are added to the gate electrode of the pass transistor. However, the voltage difference of the electrodes formed in the pass transistor may be increased as the overdriving voltage is provided, and thus a device of a great size having a great enduring voltage should be used to perform a reliable operation. Accordingly, the overdriving voltage provided to the pass transistor should be determined according to a size and an enduring voltage of the device.

Referring to FIG. 4 again, when it is desired that the PMOS pass transistors included in the gradation voltage group G3 be overdriven by as much as up to 1.227V, the minimum voltage of the control signal C3 may be 4.5V. When the control signal C3 swings between 7.5V and 4.5V, a voltage difference of the electrodes formed in the PMOS transistors arranged in the NW3 may be 3V. Accordingly, the maximum voltage difference of the electrodes formed in the pass transistors arranged in the DNW1 may be 2.5V, the maximum voltage difference of the electrodes formed in the pass transistors in the DNW2 may be 2.97V, and the minimum voltage difference of the electrodes formed in the pass transistors arranged in the DNW3 may be 1.773V.

As an embodiment, when the pass transistors are formed using devices having the 3V enduring voltage, the pass transistors arranged in the DNW1, DNW2, and DNW3 may be formed to have the same enduring voltage and/or size since the maximum voltage difference of the electrodes formed in the pass transistors arranged in the DNW1, DNW2, and DNW3 is the enduring voltage or less. As another embodiment, pass transistors having different enduring voltages and/or sizes may be used according to the gradation voltage groups by forming a difference between the maximum gradation voltage and the minimum gradation voltage in any one gradation voltage group and a difference between the maximum gradation voltage and the minimum gradation voltage in another gradation voltage group to be different.

According to a conventional art, the pass transistors included in the DAC have been designed using devices having an enduring voltage corresponding to a difference between a ground potential and the greatest gradation voltage regardless of the maximum voltage difference of electrodes of devices. Accordingly, the pass transistors included in the DAC have been designed to have a great size to have a great enduring voltage even when the maximum voltage difference of the electrodes does not reach a difference of the ground potential and the greatest gradation voltage.

That is, when the top voltage $V_T$ provided to the resistor string 210 is 7.5V, the bottom voltage $V_B$ is 0.5V, and the pass transistors are formed using devices having a 7.5V enduring voltage, which is a difference between a reference voltage which is a ground potential and the top voltage $V_T$.

However, according to an embodiment of the present invention, since the pass transistors are arranged in the same well by the pass transistors being grouped based on the output gradation voltages and are formed to have a size having an enduring voltage corresponding to a difference of the gradation voltages provided by the pass transistors arranged in the same well by the well bias voltage being applied to the well, sizes of the pass transistors may be decreased so that an area needed for forming the DAC may be decreased.

Further, according to an embodiment of the present invention, since the decoder 230 may drive the pass transistors included in the NW and the PW formed in the same deep well using a signal having the same swing, a driving circuit may not need to be formed for each of the pass transistor groups arranged in each well so that an area needed for the driving circuit may be decreased. Moreover, since an space between the NW and the PW formed in the same deep well is smaller than that between two different deep wells, an area needed for forming the source driver may be decreased by respectively arranging the NMOS pass transistors and the PMOS pass transistors in the NW and the PW formed in the same deep well.

FIG. 5 is a circuit diagram illustrating the DAC 200 according to another embodiment of the present invention. According to the other embodiment shown in FIG. 5, the gradation voltages $v_0, v_1, \ldots,$ and $v_{255}$ may be divided into a plurality of gradation voltage groups G1, G2, G3, and G4 according to the gradation voltages. As shown in the other embodiment shown in FIG. 5, the gradation voltage group may be output to pass transistors having the same type when the gradation voltage group G4 including the greatest gradation voltage is excluded. According to an embodiment, which is not shown, a gradation voltage group may be output to pass transistors having the same type when the gradation voltage group including the smallest gradation voltage is excluded.

According to the other embodiment shown in FIG. 5, each of the gradation voltage groups may be arranged in the same deep well. The gradation voltages $v_{m+1}$ to $v_{255}$ included in the gradation voltage group including $v_{255}$, which is the greatest gradation voltage, may be output to the PMOS pass transistors arranged in the NW3, and the gradation voltages $v_0$ to $v_m$ may be respectively output to the NMOS pass transistors arranged in PW1 to PW4. The PW1, PW2, and PW3 may be arranged in the DNW1, DNW2, and DNW3, which are different from each other. The PW4 and the NW1 may be formed in the same DNW4.

The NW and the PWs may be biased by different well bias voltages $V_{PW1}$, $V_{PW2}$, $V_{PW3}$, $V_{PW4}$, and $V_{NW1}$, and each of the deep wells may be biased by each of the well bias voltages. Further, the well bias voltage of the PW may be provided to the body electrodes of the NMOS pass transistors arranged in the PW, and the well bias voltage of the NW may be provided to the body electrodes of the PMOS pass transistors arranged in the NW.

The decoder 230 may form a voltage that swings between the minimum gradation voltage among the gradation voltages provided by the pass transistors arranged in each well and a voltage in which at least a threshold voltage of the pass transistor is added to the maximum gradation voltage, and may control the pass transistors using the voltage.

As an example, the minimum gradation voltage among the gradation voltages provided by the pass transistors arranged in the PW may be provided to each PW as the well bias voltage. Further, the maximum gradation voltage among the gradation voltages provided by the pass transistors arranged in the NW may be provided to each NW as the well bias voltage. As an example, assume that $v_0$ is 0.5V, $v_j$ is 1.5V, $v_{j+1}$ is 1.527V, $v_k$ is 3V, $V_{k+1}$ is 3.027V, $v_l$ is 4.5V, $v_{l+1}$ is 4.527V, $v_m$ is 6V, $v_{m+1}$ is 6.027V, $v_{255}$ is 7.5V, the threshold voltage of the NMOS pass transistor is 0.3V, and the threshold voltage of the PMOS pass transistor is −0.3V.

In the other embodiment shown in FIG. 5, a 1.5V voltage may be provided to a drain electrode of the NMOS pass transistor providing $v_j$, which is the maximum gradation voltage among the NMOS transistors arranged in the PW1, and a 0.5V well bias voltage may be provided to the body electrode. The decoder 230 may provide the control signal G1 that swings between a voltage which is greater by at least the threshold voltage than the maximum gradation voltage $v_j$ and the smallest gradation voltage $v_0$ among the gradation voltages provided by the pass transistors arranged in the PW1, and may control the pass transistors using the control signal G1. Accordingly, the control signal G1 that swings between the maximum gradation voltage 1.5V+the threshold voltage=1.8V, and the smallest gradation voltage of 0.5V may be provided to the NMOS pass transistors arranged in the PW1.

Accordingly, a 1.5V voltage difference of the electrodes, which corresponds to a difference between 1.8V and 0.5V, may be formed in the NMOS pass transistors arranged in the PW1. Further, the decoder may provide a voltage in which an overdriving voltage is added to a turn-on voltage to overdrive the NMOS pass transistors, and the voltage difference of the electrodes formed in the NMOS pass transistors may be 1.8V+the overdriving voltage. A resistance between a drain electrode and a source electrode of the pass transistor may be decreased by providing a proper overdriving voltage, but the overdriving voltage may be determined by considering a die size and the resistance between the electrodes since devices having sizes corresponding to the increased enduring voltage are needed.

Further, the minimum gradation voltage $v_{j+1}$ among the gradation voltages provided by the pass transistors arranged in the PW2 may be provided to the PW2 as the well bias voltage $V_{PW2}$. The maximum gradation voltage may be 3V, which is the voltage $v_k$ in the PW2. The decoder 230 may provide the control signal G2 that swings between 3.3V, which is greater by at least the threshold voltage than a 3V voltage $v_k$, which is the maximum gradation voltage among the gradation voltages provided by the pass transistors arranged in the PW2, and a 1.527V voltage $v_{j+1+}$, which is the minimum gradation voltage, and may control the pass transistors. As an embodiment, the decoder may control the pass transistors using the voltage in which the overdriving voltage is added as described above so that a voltage difference of the electrodes corresponding to 3.3V−1.527V=1.773V+the overdriving voltage may be formed in the NMOS pass transistors arranged in the PW2. A minimum voltage difference of the electrodes may be the same as the maximum voltage difference of the electrodes formed in the NMOS pass transistors arranged in the PW3 and PW4.

The NW1 may be biased by $v_{255}$, which is the greatest gradation voltage among the gradation voltages provided by the pass transistors arranged in the NW1. The PMOS pass transistors may be arranged in the NW1 and be turned on when a gate-source voltage is the threshold voltage or less. Accordingly, the decoder 230 may provide a control signal G5 that swings between $v_{255}$, which is the greatest gradation voltage among the gradation voltages provided by the pass transistors arranged in the NW1, and a voltage in which the threshold voltage of the PMOS pass transistor having a negative value is added to $v_{m+1}$, which is the minimum gradation voltage, and may control the pass transistors. As an example, the decoder 230 may provide the control signal G5 that swings between a 7.5V voltage $v_{255}$ and 6.027+(−0.3V)=5.727V, which is the voltage in which the threshold voltage is added to the voltage $v_{m+1}$, and may control the pass transistors arranged in the NW1. Accordingly, the maximum voltage difference of the electrodes of 7.5V−5.727V=1.773V may be formed in the PMOS pass transistors arranged in the NW1.

As an embodiment, when the decoder controls the PMOS pass transistors, the decoder may control the PMOS pass transistors using a voltage in which a negative overdriving voltage is added to a minimum voltage of the control signal provided to the gate electrode. As an example, when the PMOS pass transistors are controlled using the voltage in which the overdriving voltage is added, the decoder may control the pass transistors using a control signal that swings between 7.5V and a voltage in which the overdriving voltage is added to 5.727V, and in this case, the voltage difference of the electrodes may correspond to 1.773V+the overdriving voltage. For example, when adding −0.727V as the overdriving voltage to improve a driving characteristic of the PMOS pass transistor, the control signal may swing to 5.727V+(−0.727V)=5V, and the maximum voltage difference of the electrodes formed in the PMOS pass transistors may be 7V−5V=2V.

According to a conventional art, pass transistors having an enduring voltage corresponding to a voltage difference between the ground potential and the greatest gradation voltage are used, but according to an embodiment of the present invention, a 1.8V voltage difference of the electrodes may be formed in the pass transistors arranged in the PW1, PW2, PW3, PW4, and NW1. Accordingly, a device having a small enduring voltage may be used, and a DAC having a small size may be formed since the pass transistors do not need to be formed to have an unnecessarily great size.

Figure 6:
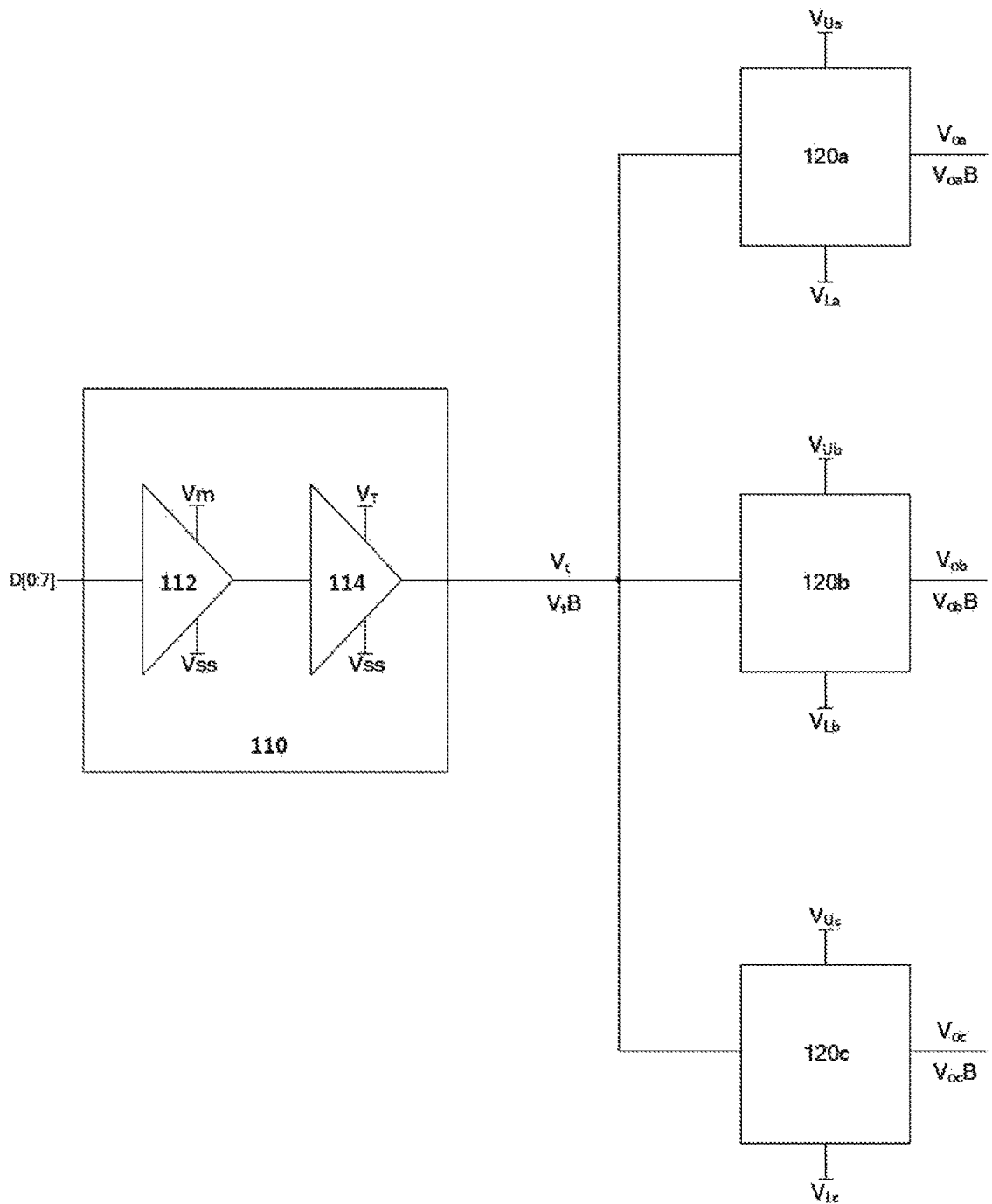
FIG. 6 is a schematic block diagram illustrating a gate driver circuit that provides a gate driving signal of a decoder according to an embodiment of the present invention.
Figure 7:
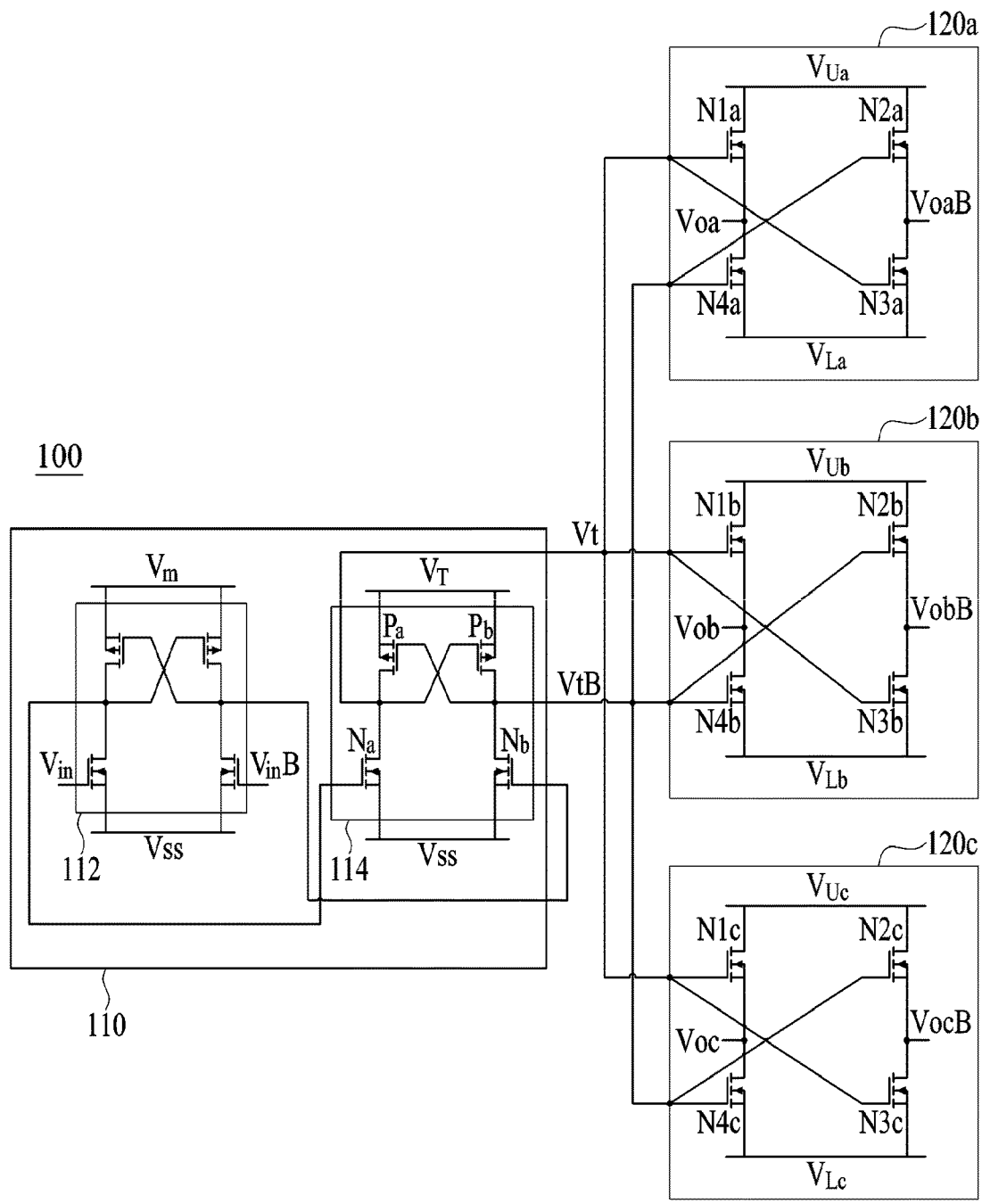
FIG. 7 is a schematic circuit diagram illustrating a gate driver circuit that forms a gate driving signal having any one bit.

FIG. 6 is a schematic block diagram illustrating the gate driver circuit 100 providing a gate driving signal of a decoder according to an embodiment of the present invention, and FIG. 7 is a schematic circuit diagram of the gate driver circuit 100 forming the gate driving signal of any one bit. Referring to FIGS. 6 and 7, the gate driver circuit 100 may include a level shifter 110 which receives a digital signal D provided from the S/H register (refer to S/H register in FIG. 2) and provides middle signals $V_t$ and $V_tB$ that swing between a reference voltage $V_{SS}$, which is a ground potential, and an upper limit voltage Vu, and a plurality of gate driving modules 120a, 120b, and 120c that receive the middle signals $V_t$ and $V_tB$ and form preliminary signals Voa, VoaB, Vob, VobB, Voc, and VocB that swing between different voltages.

The gate driver circuit 100 may receive the digital signal D provided from the S/H register and provide the preliminary signals Voa, VoaB, Vob, VobB, Voc, and VocB which is level-shifted into a plurality of voltage levels which are able to turn on/off the NMOS pass transistors and the PMOS pass transistors to the decoder. The decoder may decode the provided digital signals, select a preliminary signal having a specific voltage level, form a control signal having a target voltage level, and provide the control signal to the pass transistor.

As an embodiment, the level shifter 110 may include a first sub module 112 which receives the digital signal D provided from the S/H register and outputs a signal that swings between the middle voltage Vm and the reference voltage $V_{SS}$, and a second sub module 114 which receives a signal provided from the first sub module 112 and outputs the middle signals $V_t$ and $V_tB$ that swing between the top voltage $V_T$ and the reference voltage $V_{SS}$.

As an embodiment, the first sub module 112 may receive the digital signal D provided from the S/H register, and may form the signal that swings between the middle voltage Vm and the reference voltage $V_{SS}$. It may be difficult to directly drive devices driven by the voltage that swings between the top voltage $V_T$ and the reference voltage $V_{SS}$ since a level of the digital signal D provided from the S/H register is low. Accordingly, the first sub module 112 may be smoothly driven by the digital signal D provided from the S/H register to provide the signal that swings between the middle voltage Vm and the reference voltage $V_{SS}$ which is able to control the devices driven by the voltage that swings between the top voltage $V_T$ and the reference voltage $V_{SS}$.

The second sub module 114 may be controlled by a signal provided from the first sub module 112, and may form the middle signals $V_t$ and $V_tB$ that swing between the top voltage $V_T$ and the reference voltage $V_{SS}$. In the embodiments shown in FIGS. 4 and 5, the top voltage may be the same as the top voltage $V_T$ provided to the resistor string, and may be the maximum voltage among the control signals provided from the decoder. The gate driving module 120 may receive the middle signals $V_t$ and $V_tB$, and form the preliminary signals Voa, VoaB, Vob, VobB, Voc, and VocB having the upper limit voltage and the lower limit voltage of the control signals provided from the decoder.

FIG. 7 is a schematic circuit diagram illustrating a gate driver circuit forming a gate driving signal of any one bit. Referring to FIG. 7, the first sub module 112 may receive signals $V_{in}$ and $V_{in}B$ included in the digital signal D from the S/H register, and output an inverted signal by inverting the signals $V_{in}$ and $V_{in}B$. The signal output from the first sub module 112 may be a signal that swings between the reference voltage $V_{SS}$, which is the ground potential, and the middle voltage Vm. As described above, the middle voltage Vm may have a level which is sufficient to be able to drive the second sub module 114 that is driven between the top voltage $V_T$ and the reference voltage $V_{SS}$.

The second sub module 114 may receive the signal output from the first sub module 112, and may form the middle signals $V_t$ and $V_tB$ that swing between the top voltage $V_T$ and the reference voltage $V_{SS}$. The middle signals $V_t$ and $V_tB$ provided from the second sub module 114 may be signals that swing between the top voltage $V_T$ and the reference voltage $V_{SS}$, and the second sub module 114 may be formed using devices having an enduring voltage corresponding to a voltage difference between the top voltage $V_T$ and the reference voltage $V_{SS}$.

The gate driving module 120 may include the plurality of unit modules 120a, 120b, and 120c forming the preliminary signals swinging between the upper limit voltage and the lower limit voltage which are different from each other. Each unit module may include a pair of NMOS transistors N1 and N4, which are serially connected, and a pair of NMOS transistors N2 and N3, which are serially connected, connected in parallel, the upper limit voltage Vu and the lower limit voltage $V_L$ may be provided to the pairs of NMOS transistors N1 and N4 and N2 and N3, and may form the preliminary signals Vo and VoB that swing between the upper limit voltage and the lower limit voltage.

In an embodiment, when the middle signal $V_t$ provided from the level shifter 110 is the upper limit voltage $V_U$ and the middle signal $V_tB$ is the reference voltage $V_{SS}$, the NMOS transistors N1 and N3 included in the gate driving module 120a, 120b, 120c may be turned on. Accordingly, voltage levels of the preliminary signals Voa and VoaB output by the gate driving modules 120a, 120b, and 120c may be $V_{Ua}$ and $V_{La}$, voltage levels of the preliminary signal Vob and VobB may be $V_{Ub}$ and $V_{Lb}$, and voltage levels of preliminary signals Voc and VocB may be $V_{Uc}$ and $V_{Lc}$. Conversely, when the middle signal $V_t$ is the reference voltage $V_{SS}$ and the middle signal $V_tB$ is the upper limit voltage $V_U$, the NMOS transistors N2 and N4 may be turned on, voltage levels of the preliminary signals Voa and VoaB may be $V_{La}$ and $V_{Ua}$, voltage levels of preliminary signals Vob and VobB may be $V_{Lb}$ and $V_{Ub}$, and voltage levels of the preliminary signal Voc and VocB may be $V_{Lc}$ and $V_{Uc}$.

For example, assume that $V_{Ua}$ is 7.5V, $V_{La}$ is 5.727V, $V_{Ub}$ is 6V, $V_{Lb}$ is 3.027V, $V_{Uc}$ is 3V, and $V_{Lc}$ is 0.5V. The gate driver circuit 100 may receive the digital signal D provided from the S/H register (refer to S/H register in FIG. 2), form the plurality of preliminary signals Voa, VoaB, Vob, VobB, Voc, and VocB that swing between the upper limit voltage and the lower limit voltage, and provide the preliminary signals to the decoder. When the digital signal D provided from the S/H register is a signal for driving the pass transistors arranged in the NW2 formed in the DNW2 shown in the embodiment of FIG. 4, a decoding logic (not shown) included in the decoder 230 may decode the digital signal D, form a control signal that swings between 6V and 3.027V using the preliminary signals Vob and VobB, and provide the control signal to control the pass transistor.

Figure 8:
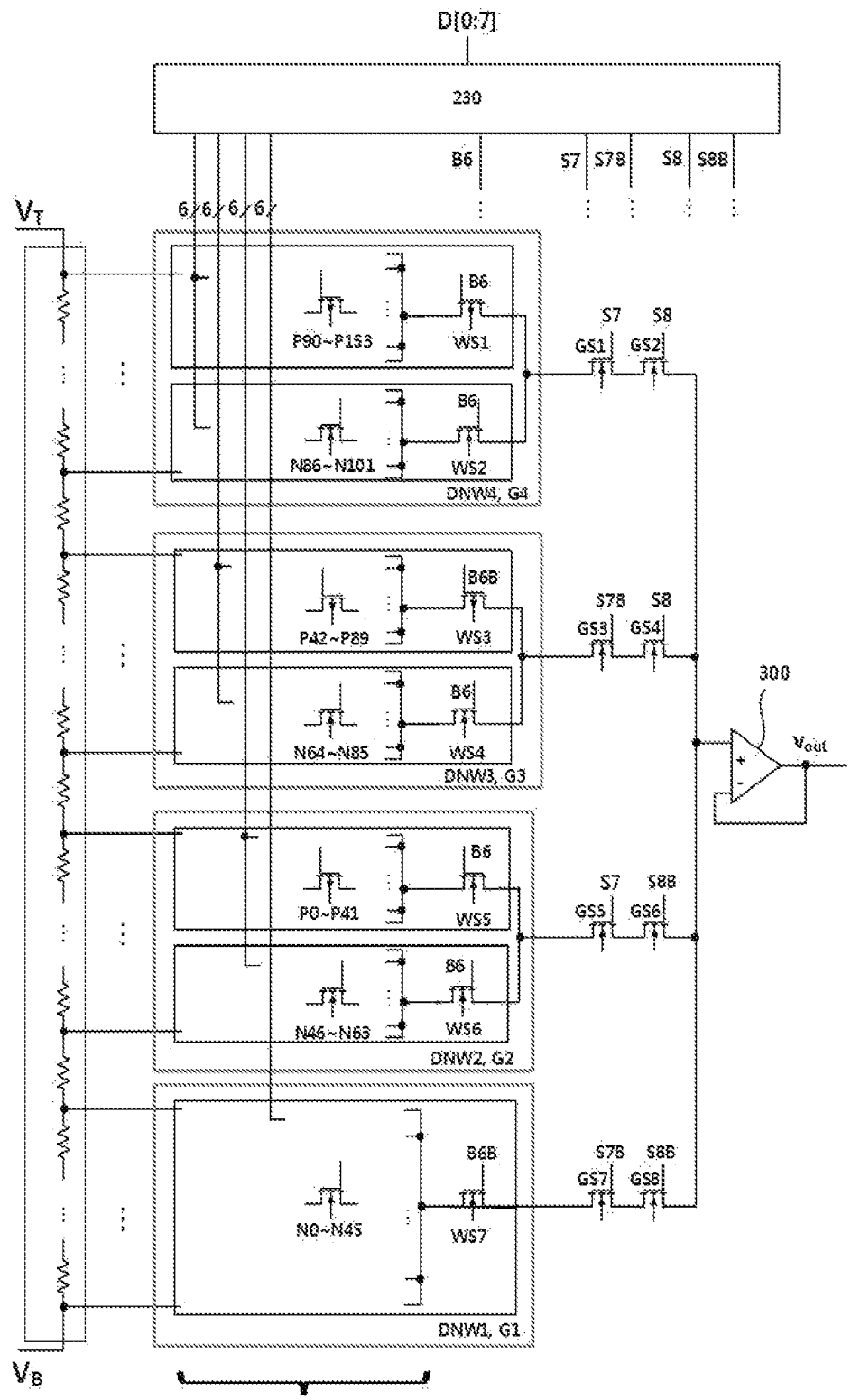
FIG. 8 is a schematic diagram illustrating a DAC that receives a digital input signal and outputs different gradation voltages according to one embodiment of the present invention.

FIG. 8 is a schematic diagram illustrating a DAC that receives a digital input signal D[0:7] and outputs 256 gradation voltages which are different from each other according to one embodiment of the present invention. In the embodiment shown in FIG. 8, the number of pass transistors which are included in the same group and arranged in the same well may not be expressed as a power of 2, and a voltage provided to a pixel and brightness of the pixel may not be in a linear relationship according to a characteristic of a display panel displaying an image. As an example, a voltage difference between adjacent gradation voltages in a low gradation voltage area may be greater than that between gradation voltages in a high gradation voltage area. Accordingly, even when differences between the maximum gradation voltages and the minimum gradation voltages provided by groups including pass transistors are the same, the number of pass transistors included in each group may not be the same. Further, when the pass transistors are arranged in different wells, it may be difficult to drive the DAC according to an embodiment of the present invention using a decoder according to a conventional art since driving signals that drive the pass transistors are also different.

Referring to FIG. 8, the pass transistors 220 may be divided into a total of 4 groups G1, G2, G3, and G4 according to output gradation voltages to be respectively arranged in the DNW1, DNW2, DNW3, and DNW4, and in the 4 groups, a difference between the maximum gradation voltage and the minimum gradation voltage of gradation voltages provided by each group may be in a range of an enduring voltage of the pass transistors to be used. As an embodiment, NMOS pass transistors included in the groups G1 to G4 may have the same enduring voltage and the same size, and PMOS pass transistors may have the same enduring voltage and the same size. As another embodiment, devices having different enduring voltages may be used according to the groups.

In FIG. 8, well bias voltages provided to the PWs and the NWs included in the DNW1, DNW2, DNW3, and DNW4 are not illustrated. This is for convenience of explanation, and the DNW1, the DNW2, the DNW3, and the DNW4, the PWs, and the NWs included in the deep wells may be biased according to the embodiments described above.

As an example, the group G1 providing the smallest gradation voltage area may include a total of 46 NMOS pass transistors N0 to N45, and the group G2 providing the next smallest gradation voltage area may include a total of 60 pass transistors having 42 PMOS pass transistors P0 to P41 and 18 NMOS pass transistors N46 to N63. The group G3 providing the second greatest gradation voltage area may include a total of 70 pass transistors having 48 PMOS transistors P42 to P89 and 22 NMOS pass transistors N64 to N85. The group G4 providing the greatest gradation voltage area may include a total of 80 pass transistors having 64 PMOS transistors P90 to P153 and 16 NMOS transistors N86 to N101. As shown, the number of pass transistors included in each group may not be expressed as a power of 2. However, the number of pass transistors included in each group is merely an example, is not meant to limit the scope of the present invention and may be changed according to a characteristic of a display panel and a gamma voltage.

In the embodiment shown in FIG. 8, the gradation voltage group G1 may provide gradation voltages using the total of 46 pass transistors, the gradation voltage group G2 may provide gradation voltages using the total of 60 pass transistors, the gradation voltage group G3 may provide gradation voltages using the total of 70 pass transistors, and the gradation voltage group G4 may provide gradation voltages using the total of 80 pass transistors. The number of pass transistors providing gradation voltages in a group in which low gradation voltages are grouped may be smaller than the number of pass transistors providing gradation voltages in a group in which high gradation voltages are grouped.

In an embodiment, which is not shown, the number of pass transistors included in each group may be the same regardless of an amplitude of a gradation voltage, and the number of pass transistors providing gradation voltages in the group in which low gradation voltages are grouped may be greater than the number of pass transistors providing gradation voltages in the group in which high gradation voltages are grouped.

The number of NMOS pass transistors included in the first group G1 to the fourth group G4 may respectively be 46, 18, 22, and 16, and the NMOS pass transistors may be controlled by a signal having 6 bits B0 to B5. Further, the number of PMOS pass transistors included in the first group G1 to the fourth group G4 may respectively be 0, 42, 48, and 64, and the PMOS pass transistors may be selected by the 6 bits. Accordingly, one NMOS pass transistor and one PMOS pass transistor included in each group may be simultaneously selected by the control signals having the 6 bits B0 to B5. The decoder 230 may provide well selection bits B6 and B6B to well selection transistors WS1, WS2, . . . , and WS7, and select an output signal. When the well selection bit B6 has a logic high, gradation voltages of the NMOS transistors may be output since the well selection transistors WS2, WS4, WS6, and WS7 are turned on, and when the well selection bit B6 has a logic low, gradation voltages of the PMOS transistors may be output since the well selection transistors WS1, WS3, and WS5 are turned on.

The decoder 230 may provide the control signal having the bits B0 to B5 and a control signal having the well selection bit B6, turn on one pass transistor for each of the groups G1 to G4 among 256 gradation voltages, and select a total of 4 gradation voltages. One among the 4 gradation voltages may be selected using group selection bits S7 and S8 and inverted group selection bits S7B and S8B. As an embodiment, since the number of pass transistors included in each group is not expressed as a power of 2 like the embodiment shown in FIG. 8, the number of bits of a well selection signal and a group selection signal may be changed according to how many groups are formed. The number of pass transistors included in each group may not be expressed as a power of 2, and the group selection bits S7 and S8 may be different from a most significant bit (MSB), which is a higher bit of a general binary decoder, as a signal obtained by performing a logical operation on data having 8 bits B0 to B7 provided to the decoder.

In the embodiment shown in FIG. 8, group selection transistors GS1, GS2, . . . , and GS8 may be controlled by the group selection bits S7 and S8, and may provide any one among gradation voltages provided by pass transistors arranged in a plurality of deep wells to the buffer amplifier 300. As an example, when the group selection bits S7 and S8 have a logic high, the group selection transistors GS1 and GS2 may be turned on, and a gradation voltage provided by the pass transistor included in the DNW4 may be provided to the buffer amplifier 300. As another example, when the group selection bit S7 has a logic high and the inverted group selection bit S8B has a logic high, the group selection transistors GS5 and GS6 may be turned on, and a gradation voltage provided by the pass transistor included in the DNW2 may be provided to the buffer amplifier 300.

Since the well selection transistors WS1, WS2, . . . , and WS7 are included in the same well as the pass transistors, the well selection transistors WS1, WS2, . . . , and WS7 may be formed to have the same enduring voltage and the same size as that of the pass transistors, and since a node outputting the gradation voltage in the group selection transistors GS1, GS2, . . . , and GS8 swings between the maximum gradation voltage and the minimum gradation voltage, the group selection transistors GS1, GS2, . . . , and GS8 may be transistors having an enduring voltage corresponding to a voltage difference between the maximum gradation voltage and the minimum gradation voltage.

The decoder 230 may control the group selection transistors GS1, GS2, . . . , and GS8 using the group selection signals S7 and S8 and the inverted group selection signals S7B and S8B. Voltages provided from outputs of the group selection transistors GS1, GS2, . . . , and GS8 may swing between the top voltage $V_T$ and the bottom voltage $V_B$. In the embodiment shown in FIG. 8, when the group selection transistors GS1, GS2, . . . , and GS8 are implemented using NMOS transistors, the group selection signals S7 and S8 and the inverted group selection signals S7B, and S8B provided from the decoder 230 may be signals that swing between a voltage in which a positive threshold voltage and a positive overdriving voltage are added to the top voltage $V_T$ and the bottom voltage $V_B$. As another example, the group selection signals S7 and S8 and the inverted group selection signals S7B and S8B may be signals that swing between a voltage in which a positive threshold voltage and a positive overdriving voltage are added to the top voltage $V_T$ and the reference voltage $V_{SS}$. As still another example, the group selection signals S7 and S8 and the inverted group selection signals S7B and S8B may be signals which swing between the top voltage $V_T$ and the reference voltage $V_{SS}$.

In an embodiment, which is not shown, some of the group selection transistors may be implemented using PMOS transistors. As an example, the group selection transistors GS1 and GS2 may be implemented using PMOS transistors. The decoder 230 may control the group selection transistors GS1, GS2, . . . , and GS8 by forming the group selection signals S7 and S8 and the inverted group selection signals S7B and S8B that swing between the top voltage $V_T$ and a voltage in which a negative threshold voltage and a negative overdriving voltage are added to the bottom voltage $V_B$. As another example, the group selection signal provided from the decoder 230 may be a signal that swings between the top voltage $V_T$ and the reference voltage $V_{SS}$.

In an embodiment, which is not shown, only one group selection transistor may be formed, and the decoder may control the group selection transistor to provide a gradation voltage to be output by performing a logical operation on the input digital signal D[0:7].

Figure 9:
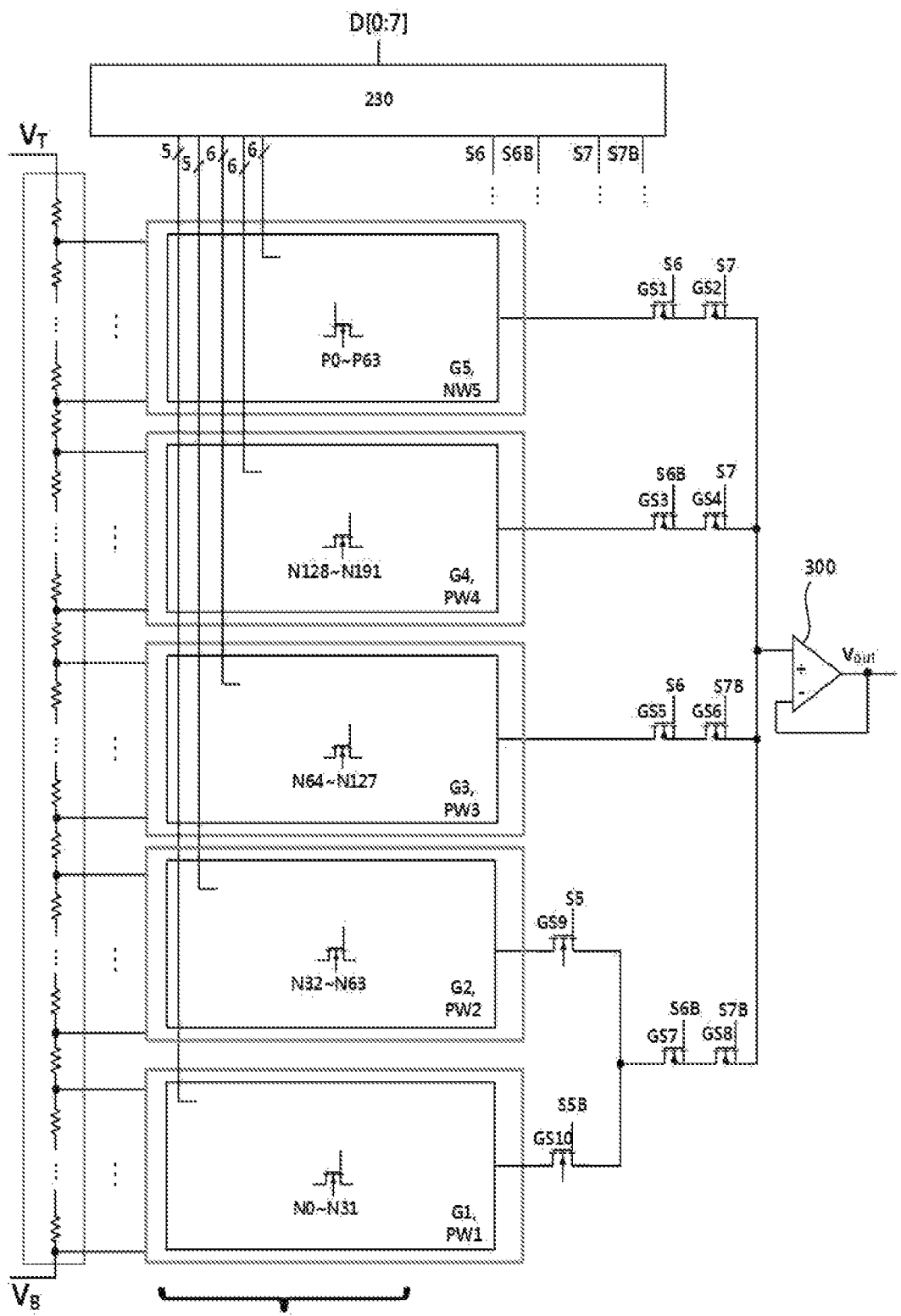
FIG. 9 a schematic diagram illustrating a DAC that receives an 8-bit digital input signal and outputs a gradation voltage corresponding to the digital input signal among 256 different gradation voltages according to another embodiment of the present invention.

FIG. 9 is a schematic diagram illustrating a DAC that receives an 8-bit digital input signal and outputs a gradation voltage corresponding to the digital input signal among 256 gradation voltages which are different from each other according to another embodiment of the present invention. In the other embodiment shown in FIG. 9, pass transistors may be NMOS pass transistors and divided into a total of 5 groups G1, G2, G3, G4, and G5 according to 256 gradation voltages, the pass transistors may be respectively arranged in the DNW1, DNW2, DNW3, DNW4, and DNW5 for each group, and a difference between the maximum gradation voltage and the minimum gradation voltage of each group may be in a range of an enduring voltage of pass transistors to be used. As an embodiment, the pass transistors may have different enduring voltages for each the group, and thus have different sizes for each group. As another embodiment, the pass transistors may have the same enduring voltage and the same size for each group.

In FIG. 9, well bias voltages provided to a PW and an NW included in the DNW1, DNW2, DNW3, DNW4, and DNW5 are not illustrated. This is for convenience of explanation, and the DNW1, the DNW2, the DNW3, the DNW4, the DNW5, the PW, and the NW included in the deep wells are biased according to the embodiments described above.

As described above, a voltage difference between adjacent gradation voltages in a low gradation voltage area may be greater than that between adjacent gradation voltages in a high gradation voltage area. Accordingly, the number of pass transistors included in each group may be a power of 2, and the number of pass transistors included in G1 and G2, which are groups outputting voltages in a low gradation voltage area, may be smaller than the number of pass transistors included in G3, G4, and G5, which are groups outputting voltages in a high gradation voltage area.

As an embodiment, the group G1 outputting the smallest gradation voltage may include a total of 32 NMOS pass transistors N0 to N31, and the group G2 outputting the next smallest gradation voltage may include 32 NMOS pass transistors N32 to N63. The decoder 230 may provide a 5-bit control signal B0:B4 to the groups G1 and G2 to control the pass transistors, and provide control signals B5 and B5B to group selection transistors GS9 and GS10. The group selection transistor GS10 may be turned on to output gradation voltages output by the pass transistors N0 to N31 included in the group G1, and the group selection transistor GS9 may be turned on to output gradation voltages output by the pass transistors N32 to N63 included in the group G2. Accordingly, the groups G1 and G2 may output any one among 64 gradation voltages by the control signals B0:B4, B5, and B5B.

Each of the groups G3, G4 and G5 may include 64 NMOS pass transistors. However, the number of pass transistors included in each group is merely an example, and does not limit the scope of the present invention and may be changed according to a characteristic of a display panel and a gamma voltage. Since each of the groups G3 to G5 includes 64 NMOS pass transistors, any one gradation voltage included in each group may be output by controlling the pass transistors using a 6-bit control signal B[0:5]. Group selection signals S6, S7, S6B, and S7B may be provided to control electrodes of the group selection transistors GS1, GS2, . . . , and GS8, and a gradation voltage provided from any one among the groups G1 to G5 due to control of the group selection transistors may be provided to the buffer amplifier 300.

The decoder 230 may provide the 6-bit control signal B[0:5] and control the pass transistors included in each group to be turned on/off. Since each of the groups G3 to G5 includes 64 pass transistors, the pass transistors included in each group may be controlled by the 6-bit digital signal. Since each of the groups G1 and G2 includes 32 pass transistors, the pass transistors included in each group may be controlled by the 5-bit control signal B0:B4.

The decoder 230 may provide the group selection signals S6, S7, S6B, and S7B to the group selection transistors GS1, GS2, . . . , and GS8, and control the groups G1, G2, G3, G4, and G5. As an example, when the group selection signals S6 and S7 have logic levels of 00 and their inverted group selection signals S6B and S7B have logic levels of 11, the group selection transistors GS9, GS10, and GS11 may be turned on. When the group selection signal S5 has a logic level of 1 and its inverted group selection signal S5B has a logic level of 0, the group selection transistor GS10 may be turned off and the group selection transistors GS9 may be turned on so that the gradation voltage output from the group G2 may be provided to the buffer amplifier 300. On the other hand, when the control signal B5 has a logic level of 0 and its inverted control signal B5B has a logic level of 1, the group selection transistor GS9 may be turned off and the group selection transistor GS10 may be turned on so that the gradation voltage output from the group G1 may be provided to the buffer amplifier 300.

The group selection signal S5 provided from the decoder 230 may have the same level as the control signal B5 which controls the pass transistors included in the groups G3, G4, and G5, but may be a signal which is able to turn on/off the group selection transistors GS9 and GS10 by swinging between the reference voltage $V_{SS}$ and the top voltage $V_T$.

Figure 10:
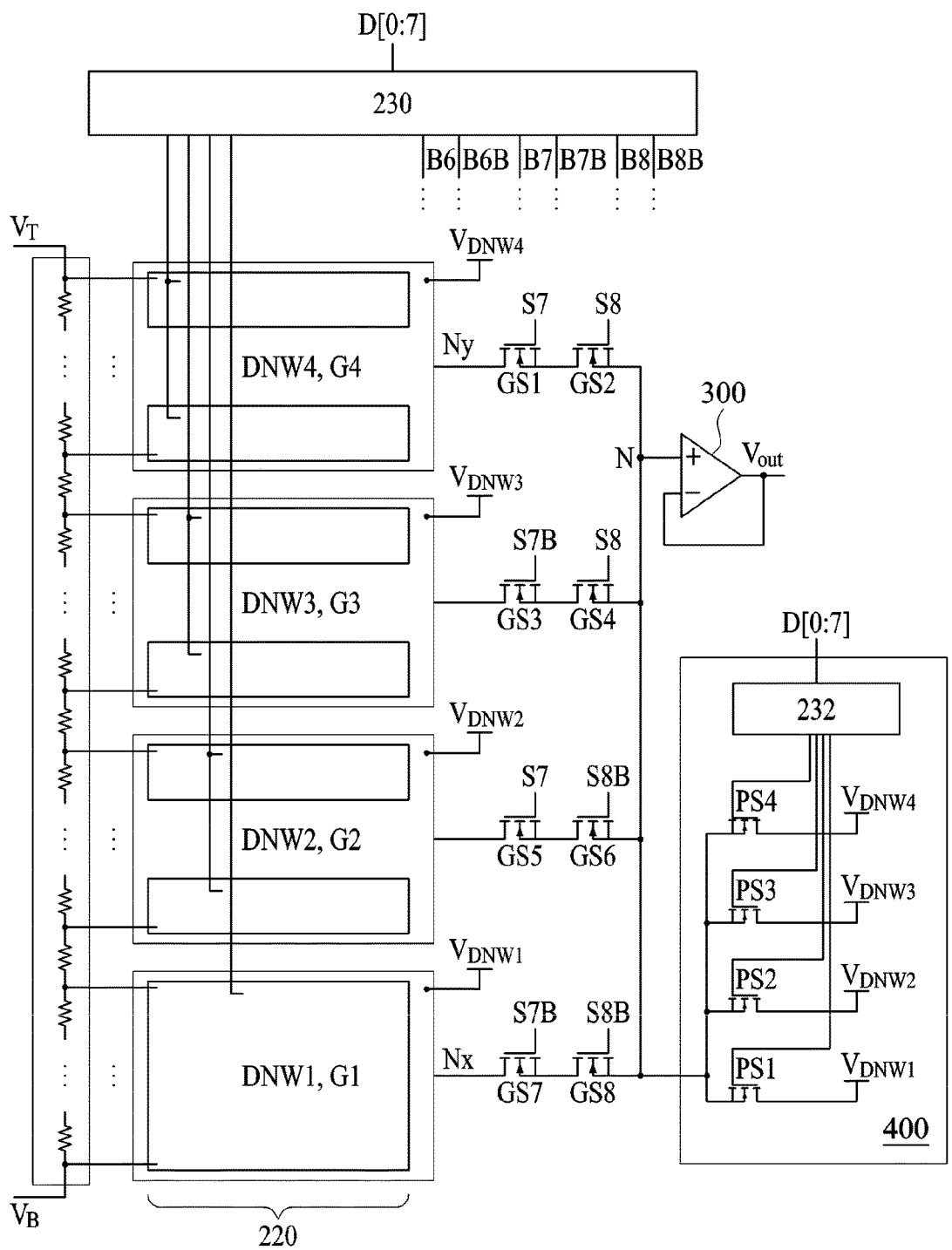
FIG. 10 is a schematic diagram illustrating a source driver including a precharge circuit.

As described above, since voltages output from the group selection transistors GS1, GS2, . . . , and GS8 deviate from an enduring voltage of the pass transistors, the group selection transistors may have a greater size and a greater enduring voltage than the pass transistors. Further, the decoder 230 may form the group selection signals S6, S7, S6B, and S7B that swing between the reference voltage $V_{SS}$ and a voltage in which a positive threshold voltage and a positive overdriving voltage are added to the top voltage $V_T$, and may provide the group selection signals S6, S7, S6B, and S7B to the group selection transistors GS1, GS2, . . . , and GS8 to control the group selection transistors GS1, GS2, . . . , and GS8. As an example which is not shown, the group selection transistors GS1, GS2, . . . , GS8 may be formed using PMOS transistors. In this embodiment, the decoder 230 may form the group selection signals S6, S6B, S7, and S7B that swings between a voltage in which a negative threshold voltage and a negative overdriving voltage are added to the bottom voltage $V_B$ and the top voltage $V_T$ to control the group selection transistors FIG. 10 is a schematic diagram illustrating a source driver including a precharge circuit 400. Referring to FIG. 10, the precharge circuit 400 may include a plurality of precharge switches PS1, PS2, PS3, and PS4, and may precharge an output node of the group selection transistors GS1, GS2, . . . , and GS8 to a potential corresponding to an output signal of pass transistors. The source driver of FIG. 10 will be described based on the embodiment shown in FIG. 8, and for convenience of explanation, a description related to the items which are the same as or similar to those which were previously described will be omitted.

Well bias voltages provided to wells in which the pass transistors 220 are arranged may be provided to one ends of the precharge switches PS1, PS2, PS3, and PS4, and the other ends of the precharge switches PS1, PS2, PS3, and PS4 may be electrically connected to output nodes of the group selection transistors. In an embodiment, a precharge decoder 232 may receive a digital input signal and control the precharge switches PS1, PS2, PS3, and PS4. In the embodiment shown in FIG. 10, an example in which potentials connected to the one ends of the precharge switches PS1, PS2, PS3, and PS4 are well bias voltages respectively provided to the DNW2, DNW3, and DNW4, is illustrated, but according to an embodiment, which is not shown, well bias voltages provided to a PWs in DNW1, DNW2, DNW3, and DNW4 may be provided to the one ends of the precharge switches PS1, PS2, PS3, and PS4. When the well bias voltage is provided using a separate power source, the power source providing the well bias voltage may be electrically connected to the one ends of the precharge switches PS1, PS2, PS3, and PS4. As another embodiment, when the well bias voltage is received from the resistor string 210 and the well bias voltage are provided using a buffer, an output signal of the buffer may be connected to the one ends of the precharge switches PS1, PS2, PS3, and PS4.

The precharge decoder 232 may receive input digital bits D[0:7], and recognize a group selection transistor providing an output signal to be output after a current output signal which is currently output. When the current output signal is output through the group selection transistors GS7 and GS8 and a next output signal has to be output through the group selection transistors GS1 and GS2, the decoder 230 may control the group selection transistors GS1, GS2, . . . , and GS8 to be turned off after the current output signal is provided. The precharge decoder 232 may precharge an output node N of the group selection transistors to a well bias voltage $V_{DNW4}$ of a well in which a pass transistor providing the next output signal is arranged after the group selection transistors GS1, GS2, . . . , and GS8 are turned off. As an example, a potential that precharges the output node N may be a bias voltage biasing an NW formed in a deep well. As another example, the potential that precharges the output node N may be a bias voltage biasing a PW formed in the deep well.

When a precharge operation is not performed, the group selection transistors GS7 and GS8 may be turned off and the group selection transistors GS1 and GS2 may be turned on to provide the next output signal. When the group selection transistors GS1 and GS2 are turned on and the group selection transistors GS7 and GS8 are not completely turned off or when mutual interference occurs by a parasitic resistance between a node Nx and a node Ny, a voltage of the node Ny may be less than the well bias voltage $V_{DNW4}$, and thus an unwanted latch up phenomenon may occur. Accordingly, the unwanted phenomenon may be prevented by precharging an output node of the group selection transistors GS1, GS2, . . . , and GS8 providing the next output signal to the well bias voltage.

After the precharge operation is performed, the decoder 230 may provide the gradation voltage to the buffer amplifier 300 by turning on the pass transistor and the group selection transistors GS1 and GS2 to output a target gradation voltage. The buffer amplifier 300 may drive a pixel by outputting the provided signal.

According to the embodiments of the present invention, the DAC and the source driver may be formed using devices having small sizes using well biasing, and thus a DAC and source driver having a small die size may be formed.

While the present invention has been described with reference to embodiments shown in the accompanying drawings in order to facilitate understanding of the present invention, those skilled in the art should understand that the embodiments are merely examples and are merely illustrative, and various modifications and equivalent other embodiments are possible. Accordingly, the technical spirit and scope of the present invention may be defined by the appended claims.

What is claimed is:

1. A digital-to-analog converter, comprising:
a resistor string configured to provide a plurality of gradation voltages formed by receiving a top voltage at one end thereof and a bottom voltage at the other end;
a plurality of pass transistors including a pass transistor having one end which is electrically connected to the resistor string and outputting any one among the plurality of gradation voltages; and
a decoder configured to control the plurality of pass transistors,
wherein the plurality of the pass transistors are included in any one group of a plurality of groups according to values of the gradation voltages, and pass transistors included in the same group have the same type,
wherein the pass transistors included in the same group are NMOS pass transistors, and the decoder controls the pass transistors using a control signal that swings between a minimum voltage of gradation voltages output from the pass transistors included in the same group and a voltage in which a threshold voltage of the pass transistor is added to a maximum voltage of the gradation voltages output from the pass transistors included in the same group.

2. The digital-to-analog converter of claim 1, wherein the pass transistors included in the same group are arranged in the same deep well.

3. The digital-to-analog converter of claim 1, wherein the decoder controls the pass transistors using a control signal that swings between the minimum voltage of the gradation voltages output from the pass transistors included in the same group and a voltage in which the threshold voltage of the pass transistor and an overdriving voltage of the pass transistor are further added to the maximum voltage of the gradation voltages output from the pass transistors included in the same group.

4. The digital-to-analog converter of claim 1, wherein sizes of the pass transistors included in the same group are the same.

5. A digital-to-analog converter providing an analog signal corresponding to input digital information, comprising:
a resistor string configured to provide a plurality of gradation voltages formed by receiving a top voltage at one end thereof and a bottom voltage at the other end;
a plurality of pass transistors configured to output any one among the plurality of gradation voltages, and arranged in a plurality of groups according to output gradation voltages; and
a decoder configured to control the plurality of pass transistors, wherein the decoder forms a plurality of control signals that swing between an upper limit voltage and a lower limit voltage for each group and control the plurality of pass transistors, wherein the decoder comprises:

a level shifter module configured to receive a digital signal and form a middle signal that swings between the top voltage and a reference voltage;

a plurality of gate driving modules configured to be driven by the middle signal and form a plurality of preliminary signals that swing between the upper limit voltage and the lower limit voltage which are different from each other; and a decoding logic configured to receive the plurality of preliminary signals and form a control signal that drives the pass transistors.

6. The digital-to-analog converter of claim 5, wherein the decoding logic receives and decodes the plurality of preliminary signals and forms a control signal having an upper limit voltage and a lower limit voltage corresponding to a group including pass transistors that are desired to be driven.

7. The digital-to-analog converter of claim 5, wherein the level shifter module comprises:

a first sub module configured to receive the digital signal and provide a signal that swings between a middle voltage and the reference voltage; and a second sub module configured to receive a signal output from the first sub module and provide a signal that swings between the top voltage and the reference voltage, wherein the middle voltage is a voltage which is able to drive the second sub module.

8. A digital-to-analog converter, comprising:

a resistor string configured to provide a plurality of gradation voltages formed by receiving a top voltage at one end thereof and a bottom voltage at the other end;

a plurality of pass transistors including a pass transistor having one end which is electrically connected to the resistor string and outputting any one among the plurality of gradation voltages; and a decoder configured to control the plurality of pass transistors, wherein the plurality of the pass transistors are included in any one group of a plurality of groups according to values of the gradation voltages, and pass transistors included in the same group have the same type, wherein the pass transistors included in the same group are PMOS pass transistors, and the decoder controls the pass transistors using a control signal that swings between a voltage in which a threshold voltage of the pass transistor is added to a minimum voltage of gradation voltages output from the pass transistors included in the same group and a maximum voltage of the gradation voltages output from the pass transistors included in the same group.

9. The digital-to-analog converter of claim 8, wherein the pass transistors included in the same group are arranged in the same deep well.

10. The digital-to-analog converter of claim 8, wherein the decoder controls the pass transistors using a control signal that swings between the maximum voltage of the gradation voltages output from the pass transistors included in the same group and a voltage in which the threshold voltage of the pass transistor and an overdriving voltage of the pass transistor are further added to the minimum voltage of the gradation voltages output from the pass transistors included in the same group.

11. The digital-to-analog converter of claim 8, wherein sizes of the pass transistors included in the same group are the same.

* * * * *